United States Patent
Kim et al.

(10) Patent No.: US 7,213,193 B2
(45) Date of Patent: May 1, 2007

(54) APPARATUS AND METHOD FOR GENERATING CODES IN A COMMUNICATIONS SYSTEM

(75) Inventors: Min-Goo Kim, Suwon-shi (KR); Sang-Hyuck Ha, Suwon-shi (KR); Jae-Sung Jang, Kwachon-shi (KR)

(73) Assignee: Samsung Electronics Co., Ltd. (KR)

( * ) Notice: Subject to any disclaimer, the term of this patent is extended or adjusted under 35 U.S.C. 154(b) by 336 days.

(21) Appl. No.: 10/072,579

(22) Filed: Feb. 6, 2002

(65) Prior Publication Data

US 2002/0152445 A1    Oct. 17, 2002

(30) Foreign Application Priority Data

Feb. 7, 2001  (KR) .................. 2001-7139
Feb. 12, 2001 (KR) .................. 2001-6662

(51) Int. Cl.
*H03M 13/00* (2006.01)
*H03M 13/03* (2006.01)
*H04L 1/00* (2006.01)

(52) U.S. Cl. .............. 714/774; 714/790; 714/822
(58) Field of Classification Search ........... 714/774, 714/790, 822
See application file for complete search history.

(56) References Cited

U.S. PATENT DOCUMENTS

| | | | |
|---|---|---|---|
| 5,907,582 A * | 5/1999 | Yi ......................... | 375/259 |
| 6,370,669 B1 * | 4/2002 | Eroz et al. ............... | 714/774 |
| 6,397,367 B1 * | 5/2002 | Park et al. ............... | 714/786 |
| 6,519,732 B1 * | 2/2003 | Li .......................... | 714/755 |
| 6,671,851 B1 * | 12/2003 | Moulsley ............... | 714/790 |
| 6,684,367 B1 * | 1/2004 | Maerkle et al. .......... | 714/790 |
| 6,704,898 B1 * | 3/2004 | Furuskar et al. ......... | 714/751 |
| 6,711,182 B1 * | 3/2004 | Gibbs et al. ............. | 370/537 |

FOREIGN PATENT DOCUMENTS

| | | |
|---|---|---|
| JP | 2000-004196 | 1/2000 |
| WO | WO 01-54339 A1 | 7/2001 |

OTHER PUBLICATIONS

Shu Lin & Daniel J. Costello, Error Control Coding Fundamentals and Applications, Prentice-Hall, 1983 pp. 52-53 and 112-113.*
Complementary punctured convolutional (CPC) codes and their applications Kallel, S.; Communications, IEEE Transactions on vol. 43, Issue 6, Jun. 1995 pp. 2005-2009.*
U.K. Combined Search and Examination Report dated Oct. 17, 2002, issued in a counterpart application, namely Appln. No. GB0202868.6.

(Continued)

*Primary Examiner*—Joseph D. Torres
(74) *Attorney, Agent, or Firm*—The Farrell Law Firm

(57) ABSTRACT

There is provided an apparatus and method of generating two-dimensional QCTCs. The sub-code sets of QCTCs with given code rates are generated and the sub-codes are rearranged in a sub-code set with a different code rate, for use in the next transmission to a sub-code with a predetermined code rate.

6 Claims, 13 Drawing Sheets

OTHER PUBLICATIONS

Samir Kallel, "Complementary Punctured Convolutional (CPC) Codes and Their Applications", IEEE Transactions on Communications, Vo. 43, No. 6, Jun. 1995, US, pp. 2005-2009.

Tingfang Ji and Wayne E. Stark, "Concatenated Punctured Turbo Reed-Solomon Codes in a Hybrid FEC/ARQ DS/SSMA Data Network", Vehicular Technology Conference, Houston, US, May 16-20, 1999, pp. 1678-1682.

Rowitch et al., "On The Performance of Hybrid FEC/ARQ Systems Using Rate Compatible Punctured Turbo (RCPT) Codes", IEEE Transactions on Communications, vol. 48, No. 6, Jun. 2000, pp. 948-959.

Kallel et al., "An Adaptive Hybrid ARQ Scheme", Wireless Personal Communications, 12, pp. 297-311, 2000.

Chan et al., "An Adaptive Hybrid FEC/ARQ Protocol Using Turbo Codes", 1997 IEEE, pp. 541-545.

Masashi Naijoh et al., "Type-II Hybrid ARQ Scheme Using Punctured Convolutional Code with Adaptive Modulation Systems", The Institute of Electronics, Information and Communication Engineers, May 1996, pp. 19-24.

Rowitch et al., "On The Performance of Hybrid FEC/ARQ Systems Using Rate Compatible Punctured Turbo (RCPT) Codes", IEEE Transactions on Communications, vol. 48, No. 6, Jun. 2000, pp. 948-959.

\* cited by examiner

APPARATUS AND METHOD FOR GENERATING CODES IN A COMMUNICATIONS SYSTEM

PRIORITY

This application claims priority to an application entitled "Apparatus and Method for Generating Codes in Communications System" filed in the Korean Industrial Property Office on Feb. 7, 2001 and assigned Serial No. 2001-7139, and an application entitled "Apparatus and Method for Generating Codes in Communications System" filed in the Korean Industrial Property Office on Feb. 12, 2001 and assigned Serial No. 2001-6662, the contents of which are hereby incorporated by reference.

BACKGROUND OF THE INVENTION

1. Field of the Invention

The present invention relates generally to code generation in a data communication system, and in particular, to an apparatus and method for generating two-dimensional quasi-complementary turbo codes (QCTCs) and adaptive QCTCs considering the characteristics of turbo codes in a packet communication system employing a retransmission scheme or a general communication system employing a retransmission scheme.

2. Description of the Related Art

In general, a system using a retransmission scheme (e.g., hybrid ARQ: Automatic Repeat Request) performs soft combining to improve transmission throughput. The soft combining techniques are divided into packet diversity combining and packet code combining. These two combining schemes are usually called soft packet combining. Although the packet diversity combining scheme is sub-optimal in performance relative to the packet code combining scheme, it is favorable due to easy implementation when performance loss is low.

As stated above, a packet transmission system uses the packet code combining scheme to improve transmission throughput. A transmitter transmits a code with a different code rate at each packet transmission. If an error is detected from the received packet, a receiver requests a retransmission and performs soft combining between the original packet and a retransmitted packet. The retransmitted packet may have a different code from that of the previous packet. The packet code combining scheme is a process of combining N received packets with a code rate R to a code with an effective code rate of R/N prior to decoding, to thereby obtain a coding gain.

With regard to the packet diversity combining scheme, the transmitter transmits the same code with a code rate R at each packet transmission. If an error is detected from the received packet, the receiver requests a retransmission and performs soft combining between the original packet and the retransmitted packet. The retransmitted packet has an identical code to that of the previous packet. In this sense, the packet diversity combining scheme can be considered symbol averaging on a random channel. The packet diversity combining scheme reduces noise power by averaging the soft outputs of input symbols and achieves such a diversity gain as offered by a multi-path channel because the same code is repeatedly transmitted on a fading channel. However, the packet diversity combining scheme does not provide such an additional coding gain as obtained from a code structure that the packet code combining scheme offers.

Due to implementation simplicity, most packet communication systems have used the packet diversity combining scheme, which is currently being developed for use with the synchronous IS-2000 system and the asynchronous UMTS system. The reason is that the existing packet communication systems using convolutional codes and even packet code combining do not offer a great gain when convolutional codes with a code data rate are used. If a system with R=1/3 supports retransmission, there is not a wide difference in performance between the packet code combining scheme and the packet diversity combining scheme. Thus, the packet diversity combining scheme is selected considering implementation complexity. However, use of turbo codes as forward error correction codes (FEC) requires a different packet combining mechanism because the turbo codes are designed as error correction codes to have performance characteristics very close to the "Shannon Channel Capacity Limit" and their performance varies obviously with the code rates unlike convolutional codes. Therefore, it can be concluded that packet code combining is feasible for a packet communication system using turbo codes in a retransmission scheme to achieve the goal of optimum performance.

In this context, QCTCs have been proposed to increase performance in a soft combining-using system. For details of the QCTCs, see Korea Patent Application No. P2000-62151 filed by the present applicant, and filed in the U.S. Patent and Trademark Office on Oct. 17, 2001 and assigned Ser. No. 09/981,934.

Quasi-Complementary Turbo Codes (QCTCs)

A description will be made of a system that selects the packet code combining scheme or the packet diversity combining scheme using conventional QCTCs according to a data rate herein below.

In a system using R=1/5 turbo codes, for example, packet code combining applies until the overall code rate of the codes produced by soft-combining of retransmitted packets reaches 1/5. For the subsequent retransmitted packets, packet diversity combining and then packet code combining are performed. If the first packet is transmitted at a data rate of 1/3, the required redundancy symbols are provided at a retransmission request to make the overall code rate 1/5. Thus, when a receiver receives both packets, the overall code rate becomes 1/5. Each of the following packets is repeated prior to transmission and the receiver performs packet diversity combining and then packet code combining on the retransmitted packets at the data rate 1/5.

FIG. 1 is a graph illustrating the performance difference between packet code combining and packet diversity combining in the case of turbo codes. As shown in FIG. 1, a turbo code with a low data rate of 1/6 exhibits a greater performance gain than a turbo code with a high code rate of 1/3 with the same symbol energy Es and obtains a performance gain of 3 dB from the packet code combining. Consequently, generation of R=1/3 turbo codes by packet code combining of R=1/6 sub-codes produces a gain that turbo codes with a code rate lower than 1/3 exhibit and a gain that code combining of different codes offers, contemporaneously.

More specifically, for the same code symbol energy Es and the same code rate, turbo codes provide performance close to the "Shannon Channel Capacity Limit" according to the code rates only if iteration decoding is fully implemented, unlike convolutional codes. It is known in the art that a turbo code with a low code rate offers a greater performance gain than a turbo code with a high code rate with the same code symbol energy Es. For example, when R=1/3 is reduced to R=1/6, the performance difference can be estimated by analyzing a change in the "Shannon Channel Capacity Limit". The reason for assuming the same symbol energy Es irrespective of R=1/3 or 1/6 for the curves of FIG. 1 is that the same symbol energy Es is used for each retransmission in a hybrid ARQ (HARQ) system.

If an R=1/2 code is repeated once and the two codes are packet-diversity-combined on an AWGN (Additive White Gaussian Noise) channel, a maximum gain of 3 dB is obtained in terms of a symbol energy-to-noise ratio (Es/No). The same result occurs in the case of an R=1/6 code. Thus, a performance curve for the R=1/3 turbo code shifts left in parallel by a +3 dB scale due to a packet diversity combining gain and a performance curve for the R=1/6 turbo code also shifts left in parallel by a +3 dB scale when the same symbol energy is given. Here, the performance curves are derived with respect to the energy-to-noise ratio (Eb/No), which is measured to compare code performances according to the code rates. As a consequence, the difference between the turbo code performance curves is equivalent to the performance difference between the packet diversity combining and the packet code combining. The performance difference according to the code rates can be estimated from the "Shannon Channel Capacity Limit" and a minimum performance difference can be obtained using a minimum required signal-to-noise ratio (SNR).

In a system using turbo codes with a code rate R and a very large encoder block size L, a minimum Eb/No required to provide an error-free channel is expressed as follows:

$$Eb/No > (4^R - 1)/2R \quad (1)$$

According to the above equation, the minimum required Eb/No in AWGN at each code rate for the turbo codes is listed in Table 1 below. In Table 1, a typical Eb/No indicates a required Eb/No for a bit error rate (BER) below 0.00001 when the encoding block size L of the turbo codes is 1024.

TABLE 1

| Code rate | Required Eb/No (dB) | Typical Eb/No (dB) for BER = $10^{-5}$ |
|---|---|---|
| 3/4 | 0.86 | 3.310 |
| 2/3 | 0.57 | 2.625 |
| 1/2 | 0.00 | 1.682 |
| 3/8 | −0.414 | 1.202 |
| 1/3 | −0.55 | 0.975 |

TABLE 1-continued

| Code rate | Required Eb/No (dB) | Typical Eb/No (dB) for BER = $10^{-5}$ |
|---|---|---|
| 1/4 | −0.82 | 0.756 |
| 1/5 | −0.975 | 0.626 |
| 1/6 | −1.084 | 0.525 |
| 0 | −1.62 | NA |

As shown in Table 1, required Eb/No are 0.86, 0.57, 0.0, −0.414, −0.55, −0.82, −0.975, and −1.084 dB respectively, for the code rates of 3/4, 2/3, 1/2, 3/8, 1/3, 1/4, 1/5, and 1/6. An at least 0.53 dB performance difference exists between an R=1/3 code using system and an R=1/6 code using system. This is a minimum performance difference based on the "Shannon Channel Capacity Limit". Considering implementation of a real decoder and system environment, the difference becomes wider. From a simulation, an approximate 1.12 dB performance difference was observed between a system using packet code combining for R=2/3 codes and a system using packet diversity combining for the R=1/3 codes.

Table 2 shows the performance difference between packet code combining and packet diversity combining after one retransmission in a system with a sub-code code rate of 2/3. As shown in Table 2, a minimum performance difference is 1.12 dB and the packet code combining scheme produces a higher performance gain in the turbo code-using system.

TABLE 2

| Items | Packet combining | Code combining |
|---|---|---|
| Mother code rate $R_m$ | 1/3 (X, Y0, Y'0) in FIG. 2 | 1/3 (X, Y0, Y'0) in FIG. 2 |
| Block size (L) | 496 | 496 |
| Maximum number of iterations | 8 | 8 |
| Number of transmissions | 2 | 2 |
| Actual Tx code rate Re for each transmission | 2/3 (by puncturing) | 2/3 (by puncturing) |
| Redundancy selection | Identical pattern for all transmissions. | Different pattern for all transmissions. |
| Soft combining | Packet diversity combining | Packet code combining |
| Gain through retransmissions | Symbol repetition gain | Coding gain for low rate codes |
| Minimum required Eb/No in Table 1 | +0.57 (dB) | R-2/3 +0.57 (dB) R-2/6 −0.55 (dB) |
| Required Eb/No at 2nd retransmissions | +0.57−3.0 (dB) | −0.55−3.0 (dB) |
| Relative performance gain | 0 | 1.12 (= 0.57 + 0.55) dB |
| Simulated relative gain (@ BER = $10^{-5}$) | 0 | 2.5 (dB) |

As described above, the packet code combining scheme delivers excellent performance in the turbo code-using retransmission system. Therefore, the present invention provides a sub-code generating method for optimal packet code combining in a turbo code-using retransmission system. Generation of sub-codes for packet code combining according to a predetermined rule produces the aforementioned code combining gain and maximizes the performance of a system requesting sub-codes of the same size for each retransmission.

FIG. 2 is a block diagram of a typical sub-code generating apparatus using turbo codes. As shown in FIG. 2, the sub-code generating apparatus includes a turbo encoder, a sub-code generator 204, and a controller 205.

First, with regard to the turbo encoder, a first constituent encoder 201 (constituent encoder 1) encodes an input information bit stream and outputs first code symbols, i.e., information symbols X and first parity symbols $Y_0$ and $Y_1$. An interleaver 202 interleaves the input information bit stream according to a predetermined rule. A second constituent encoder 203 (constituent encoder 2) encodes the interleaved information bit stream and outputs second code symbols, i.e., information symbols X' and second parity symbols $Y_0'$ and $Y_1'$. Thus, the output symbols of the turbo encoder are the first and second code symbols. Since the information symbols X' generated from the second constituent encoder 203 are not transmitted in reality, the code rate of the turbo encoder is 1/5.

The sub-code generator 204 generates sub-codes from the first and second code symbols received from the first and second constituent encoders 201 and 203 by puncturing and repetition under the control of the controller 205. The controller 205 stores puncturing (and repetition) matrixes generated from algorithms shown in FIGS. 4, 5 and 6 and outputs symbol selection signals according to the puncturing matrixes to the sub-code generator 204. Then, the sub-code generator 204 selects a predetermined number of code symbols within a predetermined puncturing range in response to the symbol selection signals.

The reference characters as used here, X, Y0, Y1, Y'0, and Y'1 are defined as follows.

X: systematic code symbol or information symbol

Y0: redundancy symbol from the upper component encoder of the turbo encoder

Y1: redundancy symbol from the upper component encoder of the turbo encoder

Y'0: redundancy symbol from the lower component encoder of the turbo encoder

Y'1: redundancy symbol from the lower component encoder of the turbo encoder

FIGS. 4, 5 and 6 are flowcharts illustrating sub-code (or puncturing matrix) generating procedures according to the conventional technology. Specifically, FIG. 4 illustrates a procedure of generating the first sub-code $C_0$ in a sub-code set, FIG. 5 illustrates a procedure of generating middle sub-codes $C_1$ to $C_{s-2}$ in the sub-code set, and FIG. 6 illustrates a procedure of generating the last sub-code $C_{s-1}$ in the sub-code set.

Hereinbelow, ENC1 (referred to as' first code symbols) indicate the information symbols X and the first parity symbols Y0 and Y1 output from the first component encoder 201 and ENC2 (referred to as second code symbols) indicate the second parity symbols Y'0 and Y'1 output from the second component encoder 203.

Referring to FIG. 4, a maximum code rate (Rmax) available to a transmitter is set in step 401. This value is mostly given according to the data rate used in the system. A minimum code rate (Rmin) is set to be an integer-multiple of Rmax (=k/n). Here, k is the number of input symbols and n is the number of output symbols. Although Rmin can be determined arbitrarily, it is usually 1/6, 1/7 or lower Because a coding gain is saturated due to the decrease of code rates at or below R=1/7 in turbo codes. In addition, the real code rate, i.e., mother code rate (R) of a decoder in a receiver, is determined. R is set to be greater than Rmin.

In real system implementation, Rmax and Rmin are preset. In some sense, Rmax is the code rate of the sub-codes to be generated and Rmin is a target code rate after code combining of the sub-codes. In general, Rmin is the code rate of an encoder in the transmitter.

In step 403, the number of sub-codes (S) is calculated by the following equation using Rmax and Rmin. Here, the number of the sub-codes or the number of puncturing matrixes is a minimum integer exceeding the ratio of Rmax to Rmin.

$$S = \lceil R_{max}/R_{min} \rceil \quad (2)$$

where $\lceil * \rceil$ represents a minimum integer equal to or larger than *.

A variable m is set to an initial value of 1 in step 405 and C (=m×k) is determined in step 407. C is the number of the columns of each puncturing matrix, determined by Rmax. For example, for Rmax=3/4, C can be 3, 6, 9, . . . and is set to a minimum available value for the first sub-code to be transmitted. Here, C is set to 3 for Rmax=3/4.

In step 407, the number of symbols to be selected from the puncturing matrix, Ns, is calculated by multiplying the variable m by the code length i.e., the number of code symbols n from Rmax=k/n. Ns is the number of selected symbols or the number of selected positions in each puncturing matrix and calculated by C/Rmax.

In step 409, (Ns−C) is compared with the number of the component encoders of the turbo encoder in the transmitter. The present turbo encoder is generally provided with two component encoders. Thus, it is supposed that two component encoders are used. It is determined whether (Ns−C) is 2 or greater in step 409 because the turbo encoder has two component encoders connected in parallel with the interleaver interposed as shown in FIG. 2 unlike conventional encoders using other single codes. In other words, at least one parity symbol from each component encoder must be transmitted after the information symbols are all transmitted in order to preserve the characteristics inherent in the turbo encoder.

If (Ns−C) is less than 2, only one symbol is selected from either the first parity symbol set or the second parity symbol set. From the perspective of turbo codes, either case may face problems. In the first case, sub-codes generated without second parity symbols are not turbo codes but convolutional codes with constraint length K=4 from an encoder having only the first component encoder and offers no interleaver gain that is available in the turbo encoder. On the other hand, in the second case, transmission of only systematic symbols without parity symbols from the first component encoder results in sub-codes with a code rate of 1. This is equivalent to an uncoded system without any coding gain. Accordingly, (Ns−C) must be equal to or greater than 2 to provide turbo encoder performance.

If (Ns−C) is equal to or greater than 2 in step 409, C systematic information symbols are selected from the puncturing matrix in step 411 and the other symbols are selected according to a predetermined type. For type 1, the other symbols are selected from the first and second parity symbols by Eq. (3) in step 413. The number of selected first parity symbols is equal to or greater than that of selected second parity symbols. For example, if the number of the other symbols, (Ns−C), is 3, first and second parity symbols are selected by Eq. (3) and then one more symbol is selected from the first parity symbols.

$$\lceil (Ns-C)/2 \rceil ENC1(parity)$$

$$\lfloor (Ns-C)/2 \rfloor ENC2(parity) \quad (3)$$

where $\lfloor * \rfloor$ represents a maximum integer equal to or less than *.

For type 2, the other symbols are selected from the first and second parity symbols by Eq. (4) in step 415. If a and b are given as symbol distribution rates for the first parity symbols and the second parity symbols, respectively, as many symbols as a minimum integer equal to or larger than the ratio of a(Ns−C) to (a+b) are selected from the first parity symbols and as many symbols as a maximum integer equal to or less than the ratio of b(Ns−C) to (a+b) are selected from the second parity symbols.

$$\lceil a(Ns-C)/(a+b) \rceil ENC1(parity)$$

$$\lceil b(Ns-C)/(a+b) \rceil ENC2(parity) \qquad (4)$$

where a+b=1 and a and b indicate the symbol distribution ratios for ENC1 and ENC2, respectively.

If the condition given in step 409 is not satisfied, that is, (Ns−C) is less than 2, the variable m is incremented by 1 in step 417 and the procedure returns to step 407. The purpose of step 409 is to determine whether sub-codes capable of preserving the nature of turbo codes can be generated within the present puncturing range (the size of the puncturing matrix). If the nature of the turbo codes cannot be preserved, the puncturing range is enlarged in step 417.

As described above, the initial puncturing matrix is so constructed that all information symbols are selected and at least one symbol is selected from each of the first and second parity symbol sets in the turbo encoder.

Now there will be given a description of a middle puncturing matrix generation method referring to FIG. 5. By repeating the procedure of FIG. 5, puncturing matrices $C_1$ to $C_{s-2}$ are generated.

Referring to FIG. 5, step 501 or 503 is performed according to a predetermined type. For type 1, Ns symbols are selected from the first and second parity symbol sets by Eq. (5) in step 501. Ns is the product of m and n given from Rmax (=k/n). The number of selected first parity symbols is equal to or greater than that of selected second parity symbols. Here, unselected symbols from the previous puncturing matrices are selected.

$$\lceil Ns/2 \rceil ENC1(parity)$$

$$\lceil Ns/2 \rceil ENC2(parity) \qquad (5)$$

For type 2, Ns symbols are selected from the first and second parity symbol sets according to predetermined ratios by Eq. (6) in step 503. If a and b are given as symbol distribution ratios for the first parity symbols and the second parity symbols, respectively, as many symbols as a minimum integer equal to or greater than the ratio of a(Ns) to (a+b) are selected from the first parity symbols and as many symbols as a maximum integer equal to or less than the ratio of b(Ns) to (a+b) are selected from the second parity symbols. Here, unselected symbols from the previous puncturing matrices are selected.

$$\lceil a(Ns)/(a+b) \rceil ENC1(parity)$$

$$\lceil b(Ns)/(a+b) \rceil ENC2(parity) \qquad (6)$$

A last puncturing matrix $C_{s-1}$ generating method will be described below referring to FIG. 6.

Referring to FIG. 6, the remaining unselected symbols from the previous puncturing matrices are all selected in step 601. The number of the selected symbols is defined as Ns2. In step 603, a new Ns is defined by (NsNs2). Since symbols at all positions are selected from the puncturing matrices in the process of the operations shown in FIGS. 4, 5 and 6, the new Ns is the number of symbols to be repeatedly selected.

In step 605, it is determined whether the new Ns is greater than 0. If the new Ns is 0, the procedure ends. If it is greater than 0, in step 607 as many symbols as the new Ns are selected repeatedly from the information symbols. In other words, the selected symbols are transmitted repeatedly.

The above-described sub-code generation method according to the present invention will be made clear below with specific numerical citations.

For Rmax=3/4 and R=1/5, Rmin=1/6 and S=6/(4/3)=4.5→5. Thus, five puncturing matrices are produced.

$$\{C_0, C_1, C_2, C_3, C_4\}: Rmax=3/4.$$

Since the code rate of sub-codes is 3/4 and the number of sub-codes is 5, the sub-codes have a code rate 3/20 ((1/S)× Rmax=(1/5)×(3/4)=3/20) after code combining. This implies that for 3 information bits, a receiver receives 20 code symbols. However, since 15 symbols are generated from S×n=5×4=20 and S×k=5×3=15, 5 symbols among the 15 symbols are repeatedly transmitted. The repeated symbols are preferably information symbols. In the above example, if an information symbol X is repeated once in each sub-code, a decoder receives turbo codes with R=1/5 in which information symbols occur twice for each of S sub-codes when S sub-codes are all received.

The resulting sub-codes from the procedures shown in FIGS. 4, 5 and 6 are a kind of complementary codes, but they are not in a strict sense of the term because repeated symbols exist and each sub-code exhibits a different characteristic. In view of the sub-codes being produced from turbo codes, they will be called quasi-complementary turbo codes (QCTCs).

FIG. 3 is a graph showing a comparison between the performance of HARQ using packet code combining and the performance of HARQ using packet diversity combining in terms of data throughput for a QCTC with R=2/3 and S=4 according to the conventional technology. As shown in FIG. 3, an HARQ 301 using packet code combining for the QCTC and an HARQ 302 using packet diversity combining for the QCTC show better performance than an HARQ 303 without the QCTC. For the same real time data throughput (e.g., 0.25), about −4 dB of Es/No is required in the HARQ 301, about −1.3 dB in the HARQ 302, and about 1 dB in the HARQ 303. Consequently, the use of the QCTC according to the present invention ensures a higher data throughput with less symbol energy.

The above-described sub-code generation method will be made clear below with specific numerical citations.

For $R_{max}$=3/4, R=1/5, and $R_{min}$=1/6, S=6/(4/3)=4.5→5. Thus, five puncturing matrixes are produced.

$$\{C_0, C_1, C_2, C_3, C_4\}: R_{max}=3/4.$$

Since the code rate of sub-codes is 3/4 and the number of sub-codes is 5, the sub-codes have a code rate 3/20 ((1/S)× $R_{max}$=(1/5)×(3/4)=3/20) after code combining. This implies that for 3 information bits, a receiver receives 20 code symbols. However, since 15 symbols are generated from S×n=5×4=20 and S×k=5×3=15, predetermined 5 symbols among the 15 symbols are repeatedly transmitted. The repeated symbols are preferably information symbols. In the above example, if an information symbol X is repeated once in each sub-code, a decoder receives turbo codes with R=1/5 in which information symbols occur twice in each of S sub-codes.

The resulting sub-codes from the procedures illustrated in FIGS. 4, 5 and 6 are kinds of complementary codes, although they are not in a strict sense of the term, because repeated symbols exist and each sub-code exhibits a different characteristic. In view of the sub-codes being produced from turbo codes, they will be called QCTCs.

In the conventional technology, the sub-codes of a QCTC have a predetermined code rate. For transmission of a single information word block, the sub-codes of a QCTC with a particular code rate are used. In other words, the conventional QCTC is a one-dimensional QCTC.

Under a changed channel environment or with an input information word of a changed length, a sub-code with a different code rate must be transmitted. However, no method of selecting and transmitting QCTCs with different code rates is given. In reality, it is preferable to use a sub-code of a new QCTC with a high code rate (a low code rate) other than the previous sub-codes of QCTCs in a good channel environment (in a bad channel environment). In other words, there is a need for a method of determining QCTCs adaptively according to channel environment or other factors.

SUMMARY OF THE INVENTION

It is, therefore, an object of the present invention to provide an apparatus and method for using a plurality of QCTCs with different code rates in a communication system supporting retransmission.

It is another object of the present invention to provide an apparatus and method for rearranging sub-codes in a sub-code set with a different code rate that are to be transmitted after a sub-code with a predetermined code rate in order to achieve optimum code combining at a receiver in a communication system supporting retransmission by use of a plurality of QCTCs.

It is a further object of the present invention to provide an apparatus and method for generating a sub-code with an intended code rate by grouping sub-codes of a QCTC with a particular code rate as many times as a grouping number determined by the intended code rate and transmitting the generated sub-code in order to achieve optimum code combining at a receiver in a communication system supporting retransmission by use of a plurality of QCTCs.

The foregoing and other objects of the present invention are achieved by providing an apparatus and method for generating two-dimensional QCTCs. According to one aspect of the present invention, the sub-code sets of QCTCs corresponding to a plurality of given code rates are generated. Here, each sub-code being a matrix with elements representing repetition and puncturing. Then, new sub-code sets are generated so that the matrix of each sub-code has as many columns as the least common multiple of the numbers of the columns of the sub-codes in the sub-code sets. The priority of the matrixes of sub-codes are determined in each new sub-code set so that a matrix generated by combining matrixes from two of the new sub-code sets has a QCTC characteristic. Then, the matrixes are rearranged in each new sub-code according to the priority.

According to another aspect of the present invention, a QCTC with the highest code rate among QCTCs with code rates in an integer-multiple relation is set as a primitive code in the group and the sub-codes of the primitive code are generated. The number of sub-codes to be grouped in the primitive code is determined to generate each of the other QCTCs. A sub-code to be transmitted is generated by grouping as many sub-codes of the primitive code as a grouping number corresponding to a given code rate, starting with a sub-code following the previously transmitted sub-code in the primitive code. Then, the generated sub-code is transmitted.

BRIEF DESCRIPTION OF THE DRAWINGS

The above and other objects, features and advantages of the present invention will become more apparent from the following detailed description when taken in conjunction with the accompanying drawings in which.

DETAILED DESCRIPTION OF THE PREFERRED EMBODIMENTS

Figure 1:
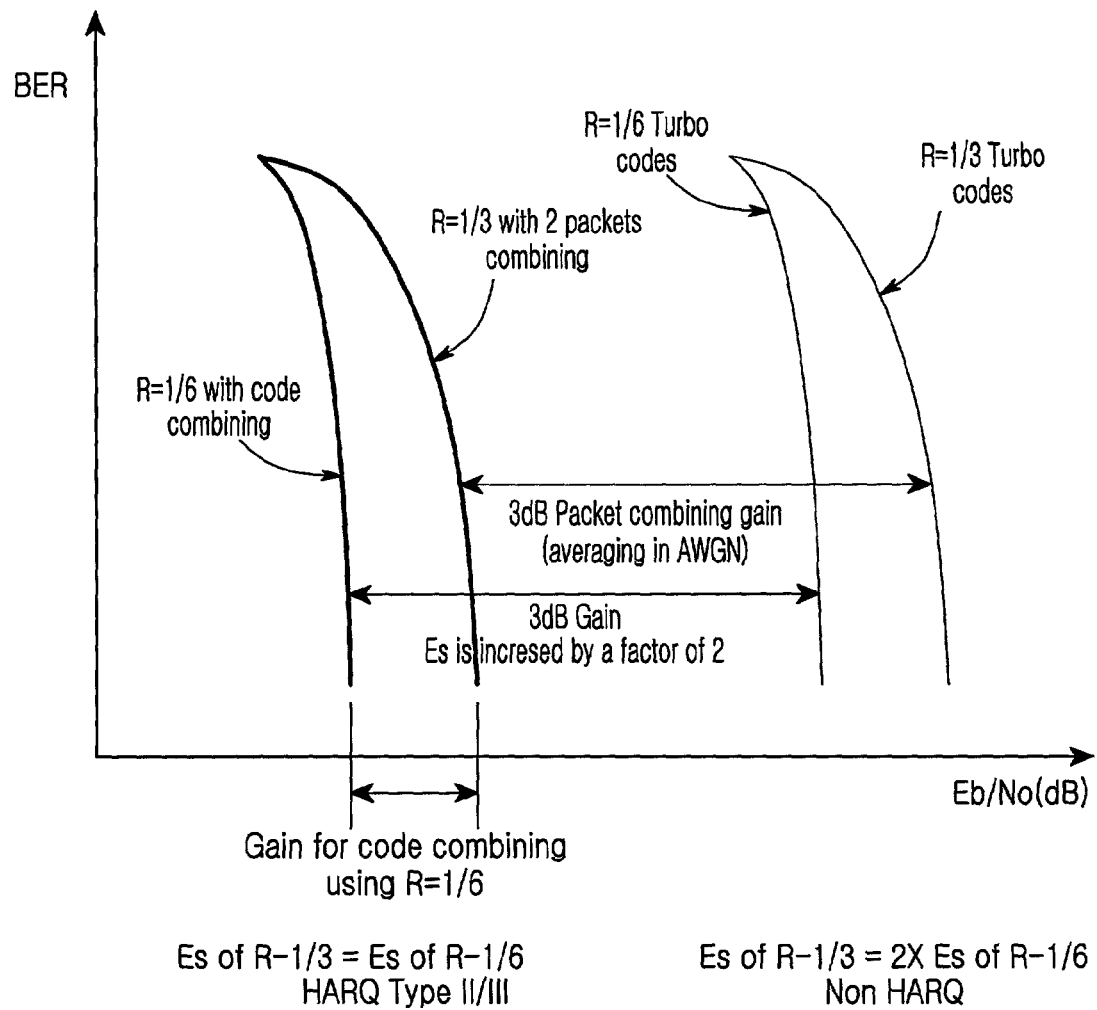
FIG. 1 is a graph illustrating the performance difference between packet code combining and packet diversity combining in a packet data system using turbo codes.
Figure 2:
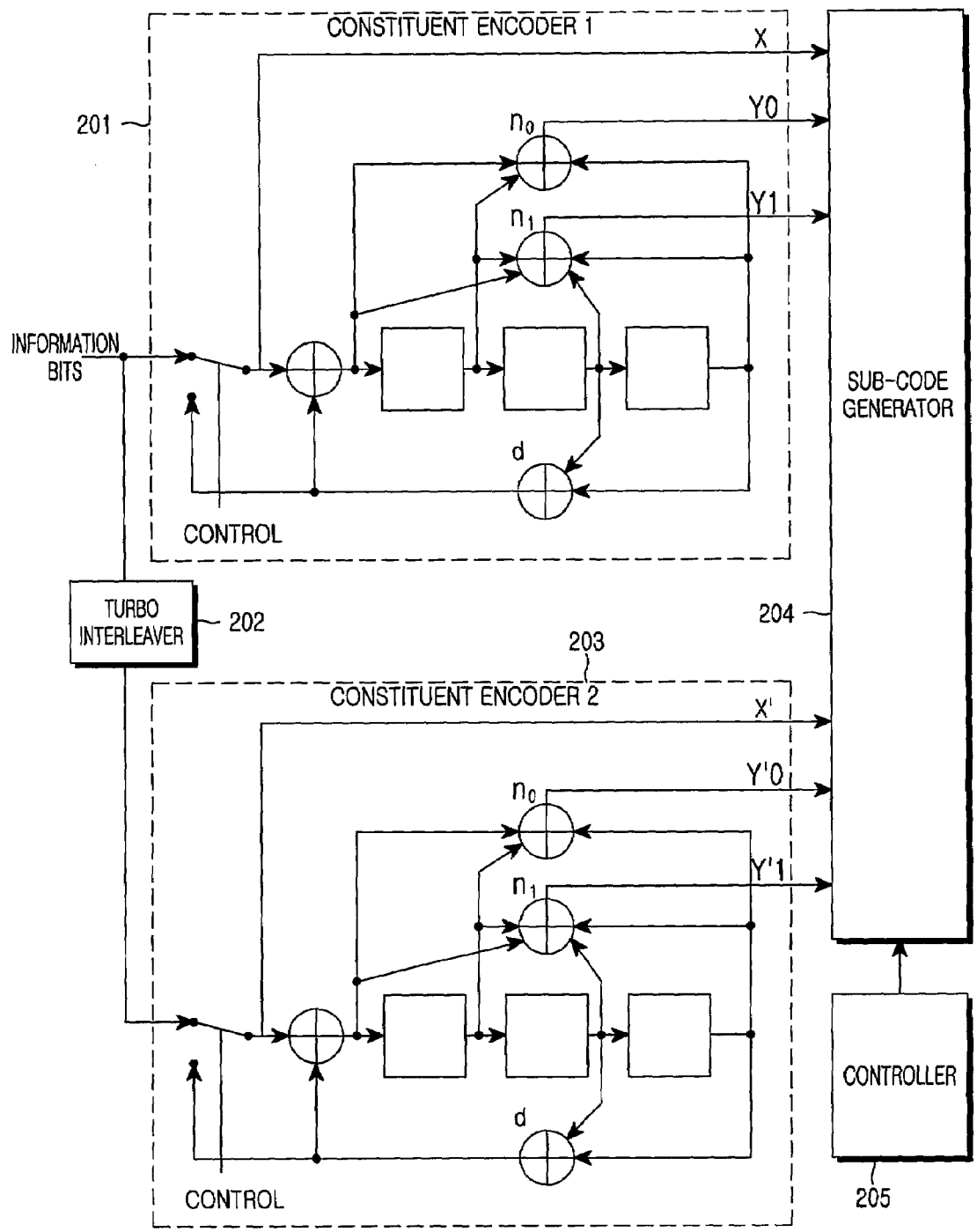
FIG. 2 is a block diagram of a typical sub-code generating apparatus.
Figure 3:
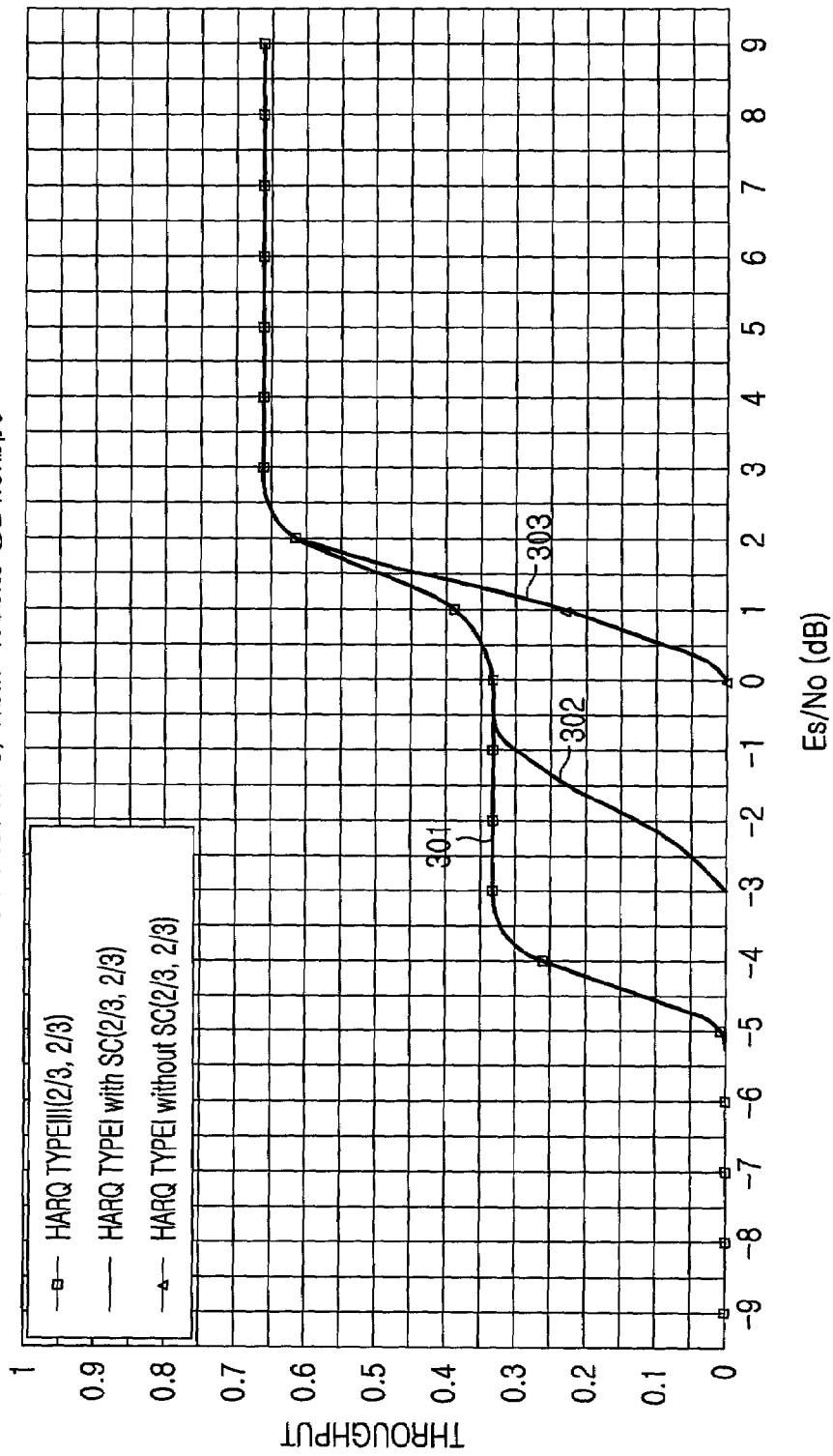
FIG. 3 is a graph illustrating the performance of a retransmission scheme without using sub-codes, the performance of a retransmission scheme implementing diversity combining with sub-codes, and a retransmission scheme implementing code combining with sub-codes.
Figure 4:
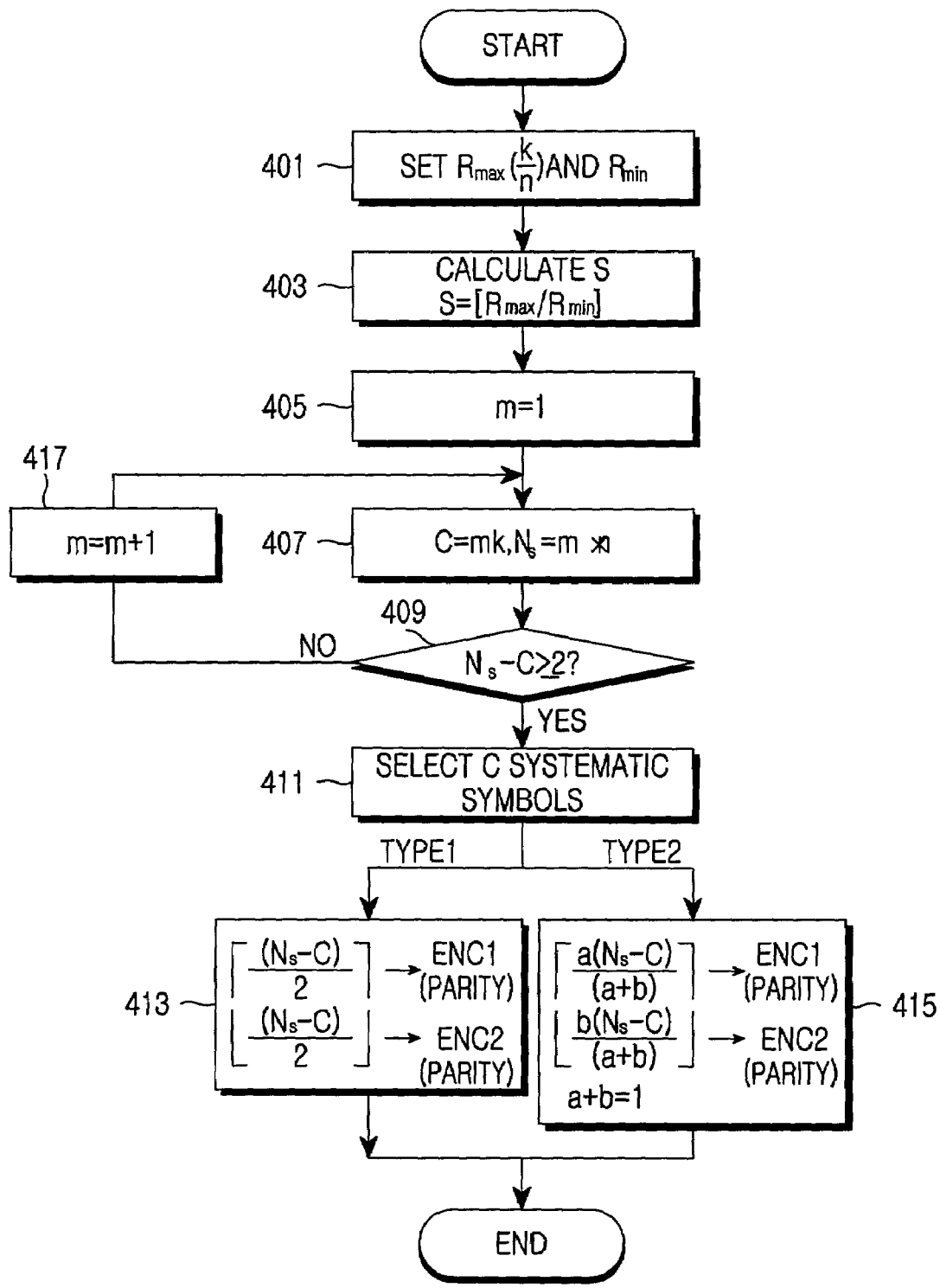
FIG. 4 is a flowchart illustrating a conventional method of generating the first sub-code in the sub-code set of quasi-complementary turbo codes.
Figure 5:
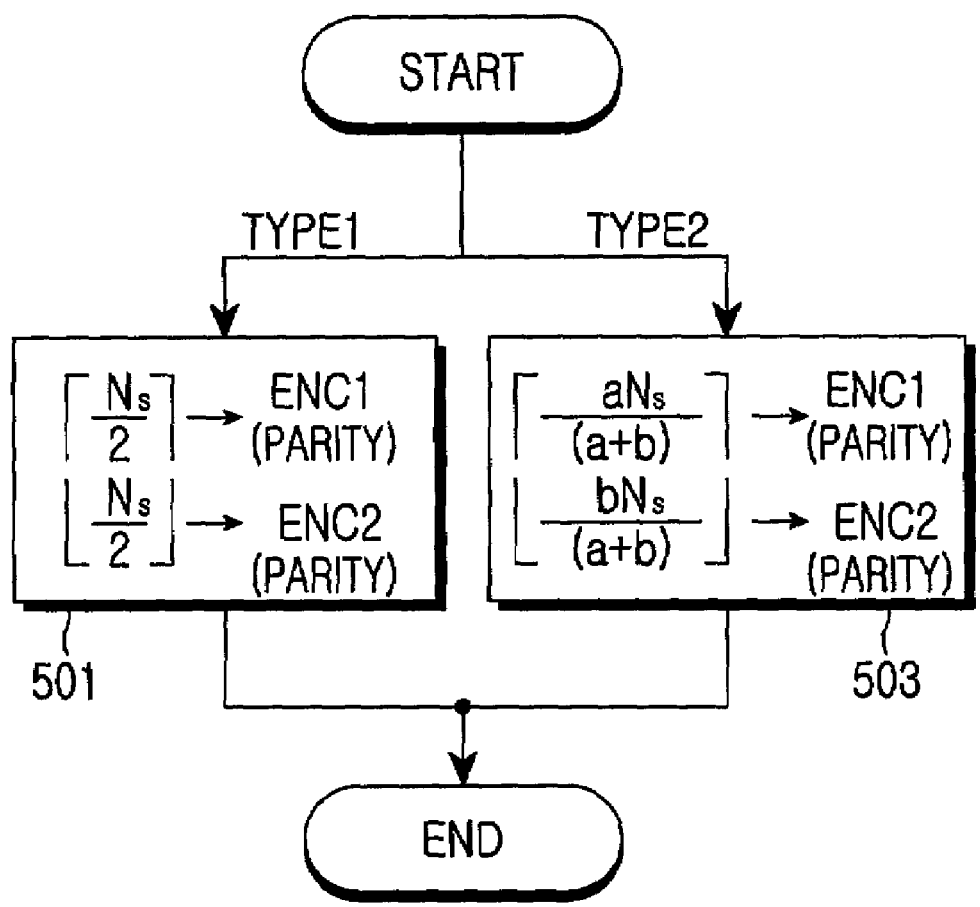
FIG. 5 is a flowchart illustrating a conventional method of generating middle sub-codes in the sub-code set of the quasi-complementary turbo codes.
Figure 6:
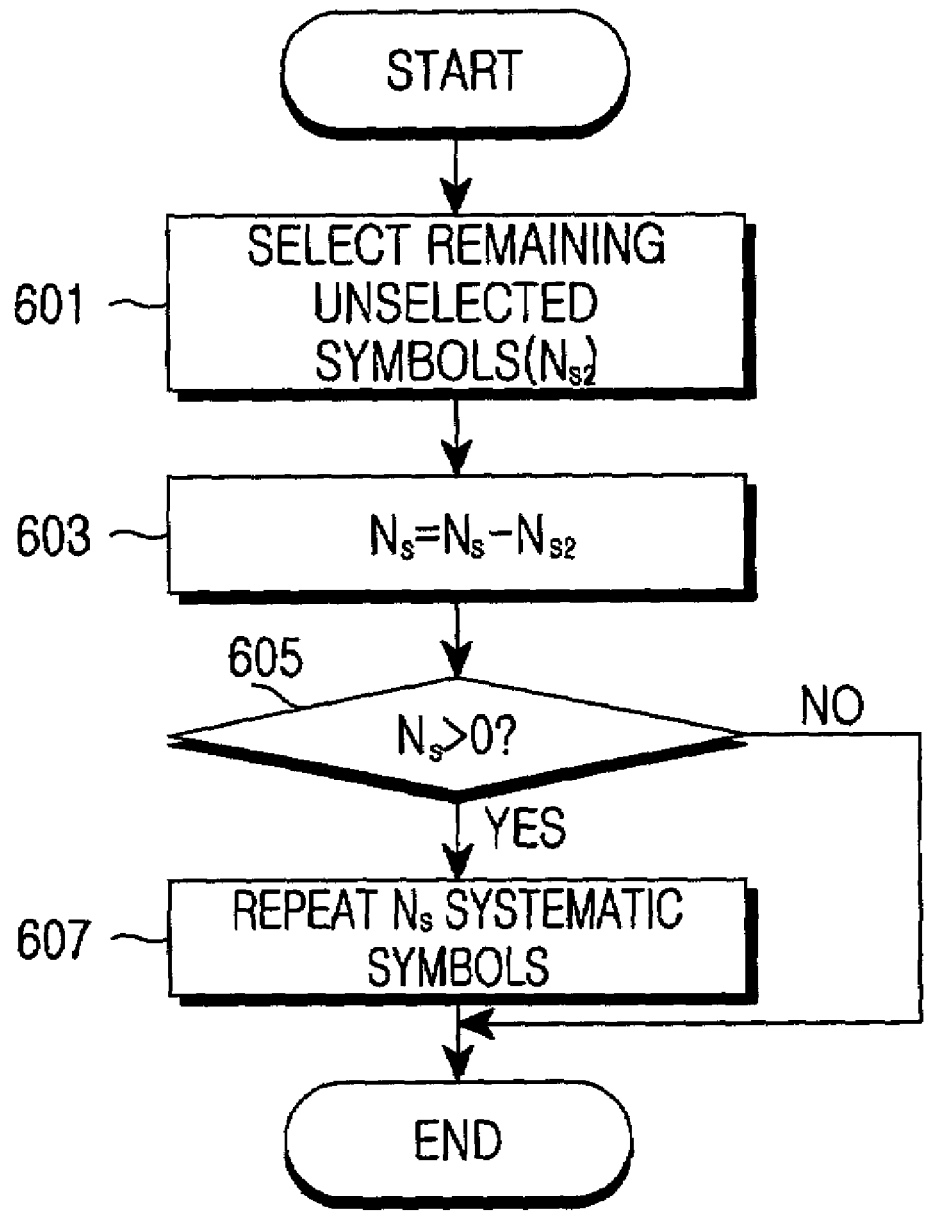
FIG. 6 is a flowchart illustrating a conventional method of generating the last sub-code in the sub-code set of the quasi-complementary turbo codes.

Preferred embodiments of the present invention will be described hereinbelow with reference to the accompanying drawings. In the following description, well-known functions or constructions are not described in detail since they would obscure the invention in unnecessary detail.

The present invention provides a method for transmitting QCTCs with different code rates according to the characteristics of turbo codes, channel environment, and the data rate of input data. Two kinds of QCTCs are proposed here, two-dimensional QCTCs and adaptive QCTCs. In the former scheme, a sub-code of a QCTC is chosen among a plurality of QCTCs with different code rates at each transmission time, and in the latter scheme, sub-codes of a particular QCTC are grouped according to a given data rate prior to transmission.

Two-Dimensional QCTCs

Consideration will be given to the case where a communication system using QCTCs changes the data rate of transmission data according to channel environment before one QCTC is fully transmitted. Let lk be an information word or a data block to be transmitted. In the case of a QCTC, the information word is coded as follows:

$$C_j(k) = QCTC\_ENC(lk), j=0,1,2,3, \ldots, S-1 \quad (10)$$

where QCTC_ENC refers to QCTC encoding, $C_j(k)$ (j=0, 1, 2, 3, ..., Si−1) is a jth sub-code of a QCTC generated from lk, and S is the set size of the QCTC, that is, the number of sub-codes that form the QCTC, determined by a sub-code code rate and a mother code rate.

As seen from the above equation, the existing one-dimensional QCTC scheme transmits symbols using the sub-codes of one QCTC sequentially until lk is completely transmitted. That is, the sub-codes are transmitted in the order of $C_0(k)$, $C_1(k)$, $C_2(k)$, ..., $C_{S-1}$ and changing a code rate (strictly speaking, the code rate of sub-codes) between transmissions has been considered without presenting a specific method. If a QCTC-using communication system is to use a QCTC with a new code rate due to channel environmental changes before the sub-codes of a QCTC are all transmitted at a data rate, it must be able to generate a plurality of QCTCs with different code rates.

$$C_{ij}(k) = QCTC\_{ENC}(lk), i=0,1,2,3, \ldots, N_s-1 \ j=0,1,2, 3, \ldots, S_i-1 \quad (11)$$

where QCTC_ENC refers to QCTC encoding, $C_{ij}(k)$ (i=0, 1, 2, 3, ..., NS−1, j=0, 1, 2, 3, ..., $S_i$−1) is a jth sub-code of an ith QCTC generated from lk, and $S_i$ is the set size of the ith QCTC, determined by a sub-code code rate and a mother code rate.

According to Eq. (11), a transmitter in a two-dimensional QCTC-using communication system chooses one of NS QCTCs adaptively to changes in transmission environment including the change of channel condition or the change of a data rate. In order to optimize performance, the system must determine an optimum transmission order by analyzing the relations between the NS QCTCs. Since a receiver can combine two-dimensional QCTCs in an arbitrary way unlike the one-dimensional QCTCs, if the structure of codes resulting from QCTC combining does not satisfy the code characteristics that turbo codes should take, performance can be deteriorated. To minimize this problem, two-dimensional QCTCs must be designed to satisfy the following conditions.

Condition 1: a minimum number of sub-codes of QCTCs must be combined to generate a code with a mother code rate. In other words, a puncturing matrix for each sub-code must be formed such that a minimum number of sub-codes are combined to achieve a mother code rate.

Condition 2: only if Condition 1 is satisfied, the elements of a puncturing matrix for the resulting code from QCTC combining must have equal weights if possible. That is, the elements of the puncturing matrix of the code generated by combining a minimum number of sub-codes have a uniform distribution of repetition and puncturing.

The most important thing to satisfy Condition 1 and Condition 2 is to form puncturing matrixes for each QCTC and determine the transmission order of sub-codes in each QCTC. Such two-dimensional QCTCs as produced using optimum one-dimensional QCTCs should have a higher gain than randomly selected two-dimensional QCTCs. In addition, the sub-code transmission order should be optimized because it is an important factor determining the performance of the two-dimensional QCTCs. Hereinbelow, generation of the two-dimensional QCTCs based on the above two principles will be described in detail.

The term "QCTC" as used herein is defined as a set of sub-codes generated based on a predetermined mother code rate and a given sub-code rate. As stated before, puncturing matrixes are used in the same sense as sub-codes.

Figure 7:
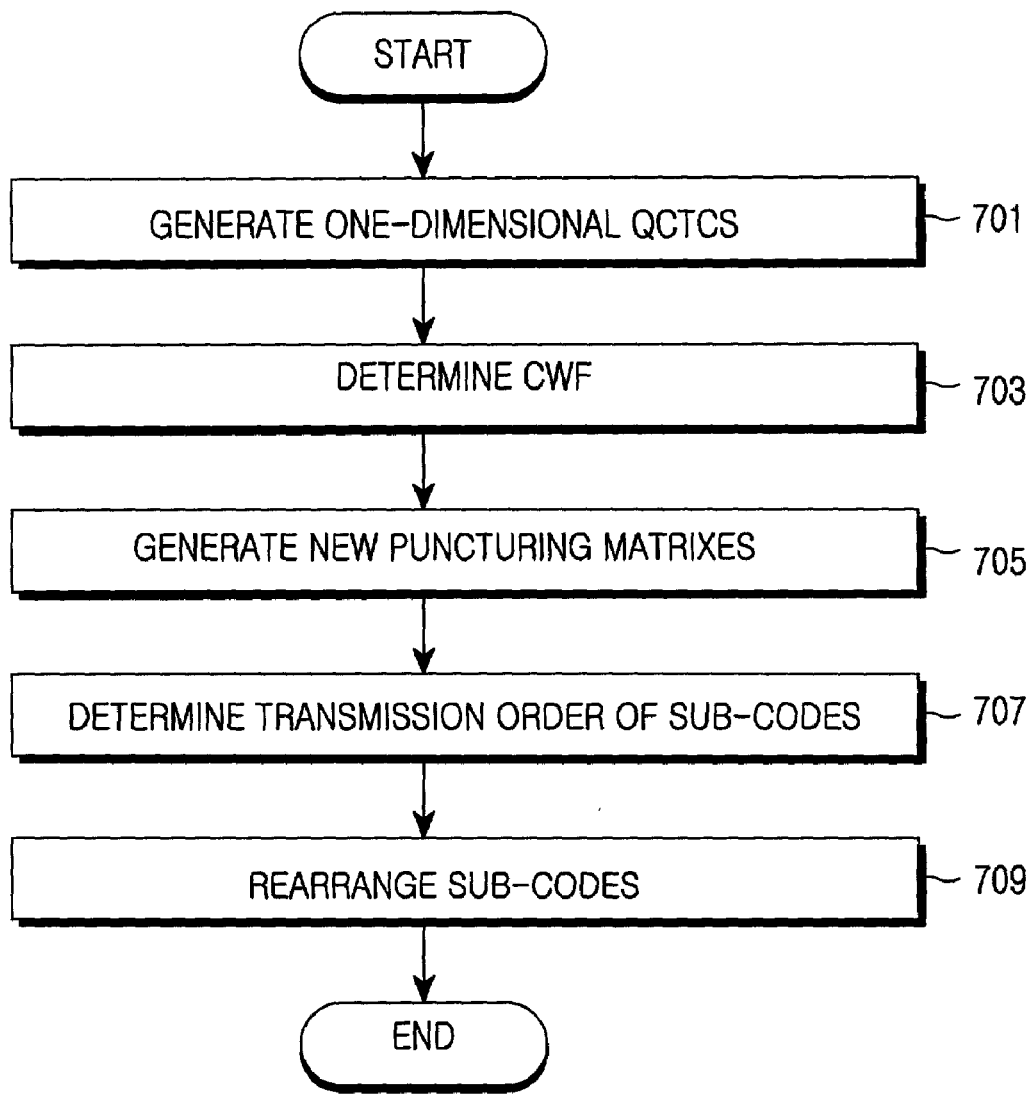
FIG. 7 is a flowchart illustrating a two-dimensional QCTC generation method according to the first embodiment of the present invention.

FIG. 7 is a flowchart illustrating a two-dimensional QCTC generation method according to the first embodiment of the present invention. Referring to FIG. 7, the sub-code sets of NS optimum one-dimensional QCTCs with given code rates are generated in step 701. The puncturing matrixes of $S_i$ sub-codes $C_{ij}$ (i=0, 1, 2, ..., NS−1, j=0, 1, 2, ..., $S_i$−1) are formed according to a predetermined mother code rate and given code rates $R_i$. This is performed in the same manner as the conventional QCTC generation except that a plurality of QCTCs $C_i$ are generated in correspondence to the given code rates. In step 703, the number of the columns in the puncturing matrix of each sub-code of a QCTC having the largest set size S among the NS QCTCs is defined as CWf (0≦f≦NS−1).

New puncturing matrixes with CWf columns are formed by repeating the existing puncturing matrixes of the QCTCs in step 705. If CWf is not an integer-multiple of the number CWi of the columns of each puncturing matrix for a QCTC $C_i$, the least common multiple (LCM) of CWf and CWi is defined as a new CWf. Then, puncturing matrixes with the new CWf should be newly formed.

In step 707, transmission priority are assigned to the puncturing matrixes of each sub-code set such that puncturing matrixes produced by combining puncturing matrixes of two different sub-code sets can take QCTC characteristics. For example, the transmission priority of sub-codes $C_{ij}$ in each sub-code set $C_0$ and $C_1$ should be determined so that uniform weights, if possible, are given to the elements of the puncturing matrix of a new code resulting from combination of the sub-codes in the QCTCs $C_0$ and $C_1$. Assignment of uniform weights mean a uniform distribution of elements representing puncturing and repetition in the puncturing matrix of a codeword generated by combining a minimum number of sub-codes. The fundamental condition to be satisfied for generating a QCTC is that an initial transmission sub-code $C_{i0}$ must have an information code symbol. In other words, information code symbols in the first row of the sub-code $C_{i0}$ must be transmitted in the first place.

In step 709, the puncturing matrixes are rearranged in each sub-code set. That is, the sequence of sub-codes $C_{ij}$ is permuted in each sub-code set $C_i$. Then, if a particular QCTC $C_i$ is selected, the sub-codes $C_{ij}$ of the QCTC $C_i$ are transmitted in an ascending order of j. For example, if QCTC transmission occurs in the order of $C_1$, $C_3$, and $C_1$, the sub-codes are transmitted in the order of $C_{10}$, $C_{30}$, and $C_{11}$. In this context, it can be said that FIG. 7 illustrates the process of rearranging sub-codes with a different code rate to be transmitted after a sub-code transmitted with a particular code rate.

The above two-dimensional QCTC generation method will be made clear with specific citations below in connection with FIG. 7. Before description, it is assumed that NS=4, the code rates $R_i$ of the QCTCs $C_i$ are given as $R_0$=1/2, $R_1$=1/3, $R_2$=1/4 and $R_3$=1/8, and a mother code rate R=1/5.

Step 701: Generation of One-Dimensional QCTCs $R_0 = 1/2, C_0$:

$$C_{00} = \begin{pmatrix} 1 & 1 \\ 1 & 0 \\ 0 & 0 \\ 0 & 1 \\ 0 & 0 \end{pmatrix} \quad C_{01} = \begin{pmatrix} 0 & 0 \\ 0 & 1 \\ 1 & 0 \\ 1 & 0 \\ 0 & 1 \end{pmatrix} \quad C_{02} = \begin{pmatrix} 1 & 1 \\ 0 & 0 \\ 0 & 1 \\ 0 & 0 \\ 1 & 0 \end{pmatrix}$$

$R_1 = 1/3, C_1$:

$$C_{10} = \begin{pmatrix} 1 \\ 1 \\ 0 \\ 1 \\ 0 \end{pmatrix} \quad C_{11} = \begin{pmatrix} 1 \\ 0 \\ 1 \\ 0 \\ 1 \end{pmatrix}$$

$R_2 = 1/4, C_2$:

$$C_{20} = \begin{pmatrix} 1 \\ 1 \\ 1 \\ 1 \\ 0 \end{pmatrix} \quad C_{21} = \begin{pmatrix} 1 \\ 1 \\ 0 \\ 1 \\ 1 \end{pmatrix}$$

$R_3 = 1/8, C_3$:

$$C_{30} = \begin{pmatrix} 2 \\ 2 \\ 1 \\ 2 \\ 1 \end{pmatrix}$$

Step 703: CWf=2

Step 705

$R_0 = 1/2, C_0$:

$$C_{00} = \begin{pmatrix} 1 & 1 \\ 1 & 0 \\ 0 & 0 \\ 0 & 1 \\ 0 & 0 \end{pmatrix} \quad C_{01} = \begin{pmatrix} 0 & 0 \\ 0 & 1 \\ 1 & 0 \\ 1 & 0 \\ 0 & 1 \end{pmatrix} \quad C_{02} = \begin{pmatrix} 1 & 1 \\ 0 & 0 \\ 0 & 1 \\ 0 & 0 \\ 1 & 0 \end{pmatrix}$$

$R_1 = 1/3, C_1$:

$$C_{10} = \begin{pmatrix} 1 & 1 \\ 1 & 1 \\ 0 & 0 \\ 1 & 1 \\ 0 & 0 \end{pmatrix} \quad C_{11} = \begin{pmatrix} 1 & 1 \\ 0 & 0 \\ 1 & 1 \\ 0 & 0 \\ 1 & 1 \end{pmatrix}$$

$R_2 = 1/4, C_2$:

$$C_{20} = \begin{pmatrix} 1 & 1 \\ 1 & 1 \\ 1 & 1 \\ 1 & 1 \\ 0 & 0 \end{pmatrix} \quad C_{21} = \begin{pmatrix} 1 & 1 \\ 1 & 1 \\ 0 & 0 \\ 1 & 1 \\ 1 & 1 \end{pmatrix}$$

$R_3 = 1/8, C_3$:

$$C_{30} = \begin{pmatrix} 2 & 2 \\ 2 & 2 \\ 1 & 1 \\ 2 & 2 \\ 1 & 1 \end{pmatrix}$$

Step 707

$R_0=1/2$, $C_0$: transmission order is reset by placing $C_{00}$ in the position of $C_{02}$, $C_{01}$ in the position of $C_{00}$, and $C_{02}$ in the position of $C_{01}$.

$$C_{00} = \begin{pmatrix} 0 & 0 \\ 0 & 1 \\ 1 & 0 \\ 1 & 0 \\ 0 & 1 \end{pmatrix} \quad C_{11} = \begin{pmatrix} 1 & 1 \\ 0 & 0 \\ 0 & 1 \\ 0 & 0 \\ 1 & 0 \end{pmatrix} \quad C_{02} = \begin{pmatrix} 1 & 1 \\ 1 & 0 \\ 0 & 0 \\ 0 & 1 \\ 0 & 0 \end{pmatrix}$$

$R_1=1/3$, $C_1$: $C_{10}$ is exchanged with $C_{11}$ in transmission order.

$$C_{10} = \begin{pmatrix} 1 & 1 \\ 0 & 0 \\ 1 & 1 \\ 0 & 0 \\ 1 & 1 \end{pmatrix} \quad C_{11} = \begin{pmatrix} 1 & 1 \\ 1 & 1 \\ 0 & 0 \\ 1 & 1 \\ 0 & 0 \end{pmatrix}$$

$R_2 = 1/4, C_2$:

$$C_{21} = \begin{pmatrix} 1 & 1 \\ 1 & 1 \\ 1 & 1 \\ 1 & 1 \\ 0 & 0 \end{pmatrix} \quad C_{22} = \begin{pmatrix} 1 & 1 \\ 1 & 1 \\ 0 & 0 \\ 1 & 1 \\ 1 & 1 \end{pmatrix}$$

$R_3 = 1/8, C_3$:

$$C_{30} = \begin{pmatrix} 2 & 2 \\ 2 & 2 \\ 1 & 1 \\ 2 & 2 \\ 1 & 1 \end{pmatrix}$$

As seen from the above, sub-codes $C_{00}$, $C_{01}$, and $C_{02}$ are rearranged to $C_{01}$, $C_{02}$, and $C_{00}$ in the sub-code set $C_0$ and sub-codes $C_{10}$ and $C_{11}$ are exchanged in position in the sub-code set $C_1$ in order to satisfy Condition 1 and Condition 2. Here, sub-codes in each sub-code set are transmitted in an ascending order of sub-code sequence numbers. For example, if QCTC transmission occurs in the order of $C_1$, $C_3$, and $C_1$, the sub-codes are transmitted in the order of $C_{10}$, $C_{30}$, and $C_{11}$.

Table 3 below lists the above-shown puncturing matrixes. As seen from Table 3, transmission of sub-codes is carried out sequentially in each sub-code set (QCTC). While each puncturing matrix for $R_1=1/3$ and $R_2=1/4$ should have two columns, it is shown to have just one column. This is a matter of representation. Thus, the same performance is offered.

A mobile station and a system read a puncturing matrix according to a given code rate (or data rate) and generate a sub-code by repeating and puncturing code symbols output from a turbo encoder with a mother code rate according to the puncturing matrix. Alternatively, they obtain the puncturing matrix using a predetermined algorithm and generate the sub-code from the puncturing matrix.

TABLE 3

| Code rate | $C_{i0}$ | $C_{i1}$ | $C_{i2}$ | $C_{i3}$ |
|---|---|---|---|---|
| $R_0 = 1/2$ | $\begin{bmatrix} X \\ Y_0 \\ Y_1 \\ Y'_0 \\ Y'_1 \end{bmatrix} = \begin{bmatrix} 0 & 0 \\ 0 & 1 \\ 1 & 0 \\ 1 & 0 \\ 0 & 1 \end{bmatrix}$ | $\begin{bmatrix} 1 & 1 \\ 0 & 0 \\ 0 & 1 \\ 0 & 0 \\ 1 & 0 \end{bmatrix}$ | $\begin{bmatrix} 1 & 1 \\ 1 & 0 \\ 0 & 0 \\ 0 & 1 \\ 0 & 0 \end{bmatrix}$ | NA |
| $R_1 = 1/3$ | $\begin{bmatrix} 1 \\ 0 \\ 1 \\ 0 \\ 1 \end{bmatrix}$ | $\begin{bmatrix} 1 \\ 1 \\ 0 \\ 1 \\ 0 \end{bmatrix}$ | NA | NA |
| $R_2 = 1/4$ | $\begin{bmatrix} 1 \\ 1 \\ 1 \\ 1 \\ 0 \end{bmatrix}$ | $\begin{bmatrix} 1 \\ 1 \\ 0 \\ 1 \\ 1 \end{bmatrix}$ | NA | NA |
| $R_3 = 1/8$ | $\begin{bmatrix} 2 \\ 2 \\ 1 \\ 2 \\ 1 \end{bmatrix}$ | NA | NA | NA |

Adaptive QCTCs

As described above, two-dimensional QCTCs with improved performance are achieved by controlling the transmission order of the sub-codes in each of the independent one-dimensional QCTCs with given code rates. Generation of independent QCTCs advantageously facilitates their optimization but has the distinctive shortcoming that in the case where the code rate $R_i$ of a particular QCTC $C_i$ is an integer-multiple of the code rate $R_k$ of another QCTC (k=0, 1, 2, ..., NS-1), the relation of QCTCs may avoid optimization even if there is room enough for optimization.

For $R_0=1/2$ and $R_2=1/4$, QCTCs $C_0$ and $C_2$ are separately obtained in a QCTC algorithm. To fully utilize the characteristics of QCTCs, it is preferable to satisfy Condition 1. To do so, two successive sub-codes of $C_0$ are grouped to transmit sub-codes with $R_2=1/4$, such as ($C_{00}+C_{01}$), ($C_{01}+C_{02}$) or ($C_{02}+C_{00}$). Then, if a sub-code with $R_0=1/2$ is combined with such sub-codes, optimum performance can be achieved.

A one-dimensional QCTC with the highest code rate among one-dimensional QCTCs with the code rates in an integer-multiple relation is defined as a primitive code $C_p$ in the group (p is an integer between 0 and NS-1). When a sub-code having a code rate lower than the primitive code $C_p$ is requested, the sub-code is generated by concatenating or grouping sub-codes of the primitive code $C_p$. This is called an adaptive QCTC scheme.

Figure 8:
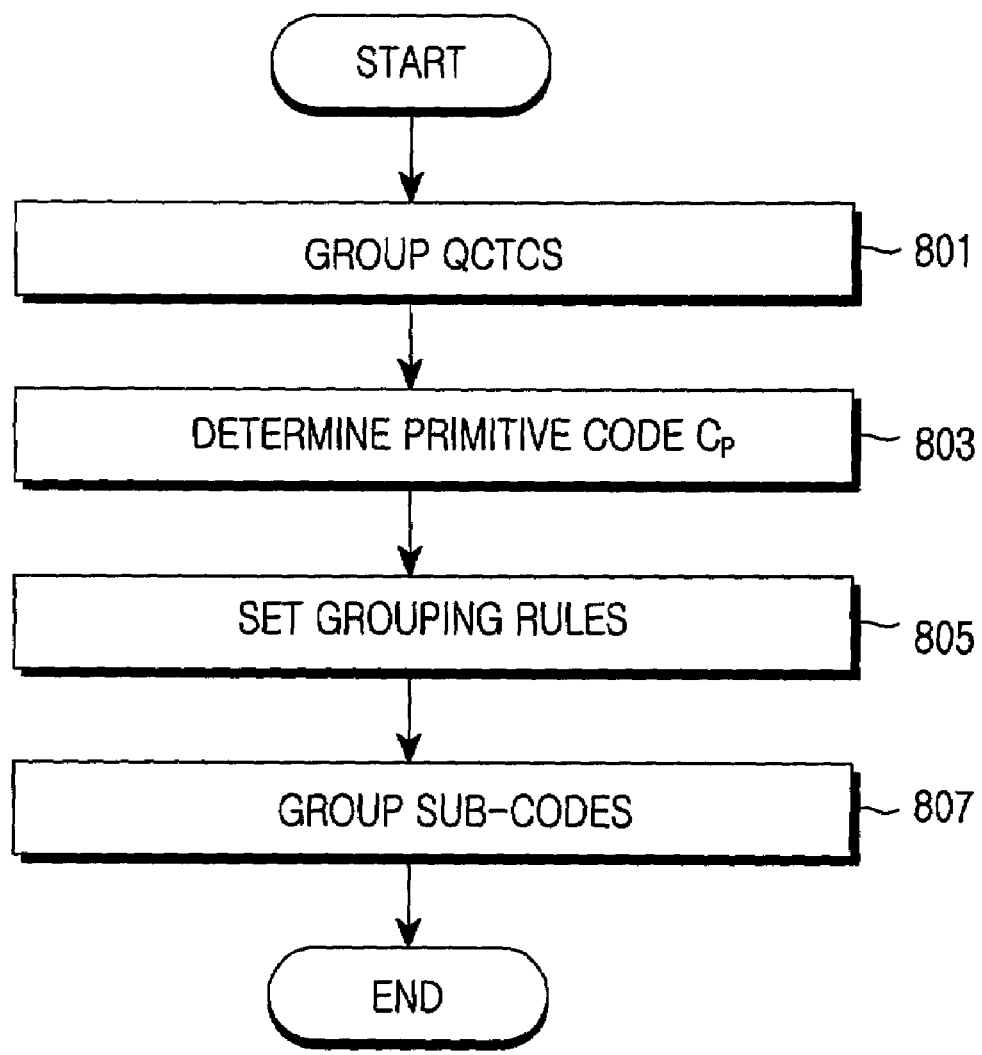
FIG. 8 is a flowchart illustrating an adaptive QCTC generation method according to the second embodiment of the present invention.

FIG. 8 is a flowchart illustrating an adaptive QCTC generation method according to another embodiment of the present invention. Referring to FIG. 8, QCTCs with code rates $R_i$ are divided into groups, each group including QCTCs with code rates in an integer-multiple relation in step 801. In step 803, a QCTC with the highest code rate is selected from each QCTC group, as a primitive code $C_p$. Thus, a plurality of primitive codes $C_p$ can be defined according to the number of groups.

In step 805, concatenation or grouping rules are set to generate sub-codes for each QCTC in each group using the sub-codes $C_{pj}$(j=0, 1, 2, ..., S−1) of each primitive code $C_p$. The rules may include the number of sub-codes to be concatenated or grouped in each primitive code. In other words, in step 807 an intended sub-code $C_{ij}$ with a code rate $R_i$ is generated by concatenating or grouping sub-codes of the primitive code $C_p$. A sub-code grouping table can be made preliminarily by considering all possible sub-code grouping. In this case, it is preferable to group sub-codes sequentially in the primitive code $C_p$.

Once a code rate (or a QCTC or a sub-code) is given, in step 807 a sub-code of QCTC with the code rate is generated by concatenating sub-codes of a corresponding primitive code $C_p$.

If the primitive code of a group grp (i.e., an arbitrary group) is $C_p$ and its set size is $S_p$, the sub-codes of QCTCs in the group grp can be expressed as follows:

$$C_{pj}{}^g \; 0 \leq j \leq S_p-1, \; 1 \leq g$$

$$\text{Group } grp = \begin{bmatrix} C^1_{p0} & C^1_{p1} & \cdots & C^1_{pS_{p-1}} \\ C^2_{p0} & C^2_{p1} & \cdots & C^2_{pS_{p-1}} \\ C^3_{p0} & C^3_{p1} & \cdots & C^3_{pS_{p-1}} \\ C^4_{p0} & C^4_{p1} & \cdots & C^4_{pS_{p-1}} \end{bmatrix} \quad (12)$$

where j denotes a sub-code index and g is the number of sub-codes to be grouped (i.e., grouping number). If g=1, the sub-codes of the primitive code $C_p$ are used without grouping. If g=2, the sub-codes of the primitive code $C_p$ are grouped by two. For the code rate of the primitive code $C_p$, $R_s=2/3$, if g=1, a new sub-code has a code rate r=2/3. If g=2, r=1/3 because one more set of code symbols are generated as compared to g=1. The above matrix, therefore, defines the code rates of QCTCs that can be obtained by grouping an integer number of sub-codes of the primitive code $C_p$, and the sub-codes of each QCTC. The maximum number of sub-codes to be grouped is not limited since it depends on system implementation. Here, up to four sub-codes can be grouped by way of example.

In the matrix, the number of rows indicates the maximum grouping number. As the number of rows increases, the code rate of a QCTC that can be implemented by sub-code grouping is decreased. The number of columns in the matrix is determined by the set size $S_p$ of the primitive code $C_p$.

For example, if the code rate of the primitive code $C_p$ is $R_s=1/2$, the first row with g=1 has the sub-codes of the primitive code $C_p$ with $R_s=1/2$. In other words, the elements of the first row in the matrix indicate the sub-codes of the primitive code $C_p$. The second row with g=2 includes the sub-codes of a QCTC with $R_s=1/4$. The third row with g=3 has the sub-codes of a QCTC with $R_s=1/6$ and the fourth row with g=4, the sub-codes of a QCTC with $R_s=1/8$.

The following equation shows the relation between each QCTC and a primitive code $C_p$ in the same group. A QCTC group with a primitive code $C_p$ with $R_s=1/2$ and $S_p=3$ is as follows:

$$g = 1, Rs = 1/2: C_{p0}^1 = C_{00}^1, C_{p1}^1 = C_{01}^1, C_{p2}^1 = C_{02}^1 \quad (13)$$

$$g = 2, Rs = 1/4: C_{p0}^2 = C_{00} \cup C_{01}, C_{p1}^2 = C_{02} \cup C_{00}, C_{p2}^2 = C_{01} \cup C_{02}$$

$$g = 3, Rs = 1/6: C_{p0}^3 = C_{00} \cup C_{01} \cup C_{02}, C_{p1}^3 = C_{00} \cup C_{01} \cup C_{02}, C_{p2}^3 = C_{00} \cup C_{01} \cup C_{02}...$$

$$g = 4, Rs = 1/8: C_{p0}^4 = C_{00} \cup C_{01} \cup C_{02} \cup C_{00}, C_{p1}^4 = C_{01} \cup C_{02} \cup C_{00} \cup C_{01}, C_{p2}^4 = C_{02} \cup C_{00} \cup C_{01} \cup C_{02}$$

Therefore, for a group with a primitive code $C_p$ with $R_s=1/2$, the matrix shown in Eq. (12) is expressed by Eq. (14) below.

$$\text{Group } grp = \begin{bmatrix} C_{p0}^1 & C_{p1}^1 & C_{p2}^1 \\ C_{p0}^2 & C_{p1}^2 & C_{p2}^2 \\ C_{p0}^3 & C_{p1}^3 & C_{p2}^3 \\ C_{p0}^4 & C_{p1}^4 & C_{p2}^4 \end{bmatrix} \quad (14)$$

In the same manner, the sub-codes of QCTCs in a different QCTC group can be arranged in a matrix according to the set size $S_p$ of its primitive code $C_p$ and the code rates of the QCTCs.

The above adaptive QCTC generation will be made clear with specific citations in connection with FIG. 8. Before description, it is assumed that NS=4, the code rates $R_i$ of QCTCs $C_i$ are given as $R_0=1/2$, $R_1=1/3$, $R_2=1/4$ and $R_3=1/8$, and a mother code rate R=1/5.

Step 801: Code Grouping
Group 0={$C_0$, $C_2$, $C_3$}={$R_0$, $R_2$, $R_3$} Code Rate={1/2, 1/4, 1/8}
Group 1={$C_1$}={$R_1$} CodeRate={1/3}
Step 803: Primitive Codes $C_p$={$C_0$, $C_1$}
$C_0$ ($R_0=1/2$): Primitive Code in Group 0
$C_1$ ($R_1=1/3$): Primitive Code in Group 1
Step 805
The sub-codes $C_{ij}$ (i=0, 1, 2, . . . , NS−1, j=0, 1, 2, . . . , $S_i$−1) of the QCTCs $C_i$ in each group are obtained using the primitive codes $C_p$.
Group 0: QCTC with $R_S=1/2$
$R_0=1/2$: {$C_{00}$, $C_{01}$, $C_{02}$}
$R_2=1/4$: {($C_{00}$, $C_{01}$), ($C_{01}$, $C_{02}$), ($C_{02}$, $C_{00}$)} (up to three cases are available)
$R_3=1/8$: {($C_{00}$, $C_{01}$, $C_{02}$, $C_{00}$), ($C_{01}$, $C_{02}$, $C_{00}$, $C_{01}$) ($C_{02}$, $C_{00}$, $C_{01}$, $C_{02}$)}
Group 1: QCTC with $R_1=1/3$
$R_1=1/3$: {$C_{20}$, $C_{21}$}

When a sub-code of the QCTC with $R_2=1/4$ is transmitted, there are two ways of determining which one is the transmitted sub-code.

(1) Implicit Sub-Code Identification

If a transmitter and a receiver have information about a transmission order of the sub-codes, the transmitter does not need to transmit the information on a separate channel. For example, in the case of group 0, the receiver stores the index of the previously received sub-code for each code rate, that is, R=1/2, 1/4, or 1/8 so that upon receipt of a new sub-code in the same group, the receiver can find out the position of the new sub-code.

(2) Explicit Sub-Code Identification

The transmitter notifies the receiver of the type of the current sub-code. Then, the receiver combines received sub-codes correspondingly. In general, if a channel condition is not very bad, implicit sub-code identification is enough. In the present invention, the two identification methods are selectively used according to the reliability of a message channel in the system.

Figure 9:
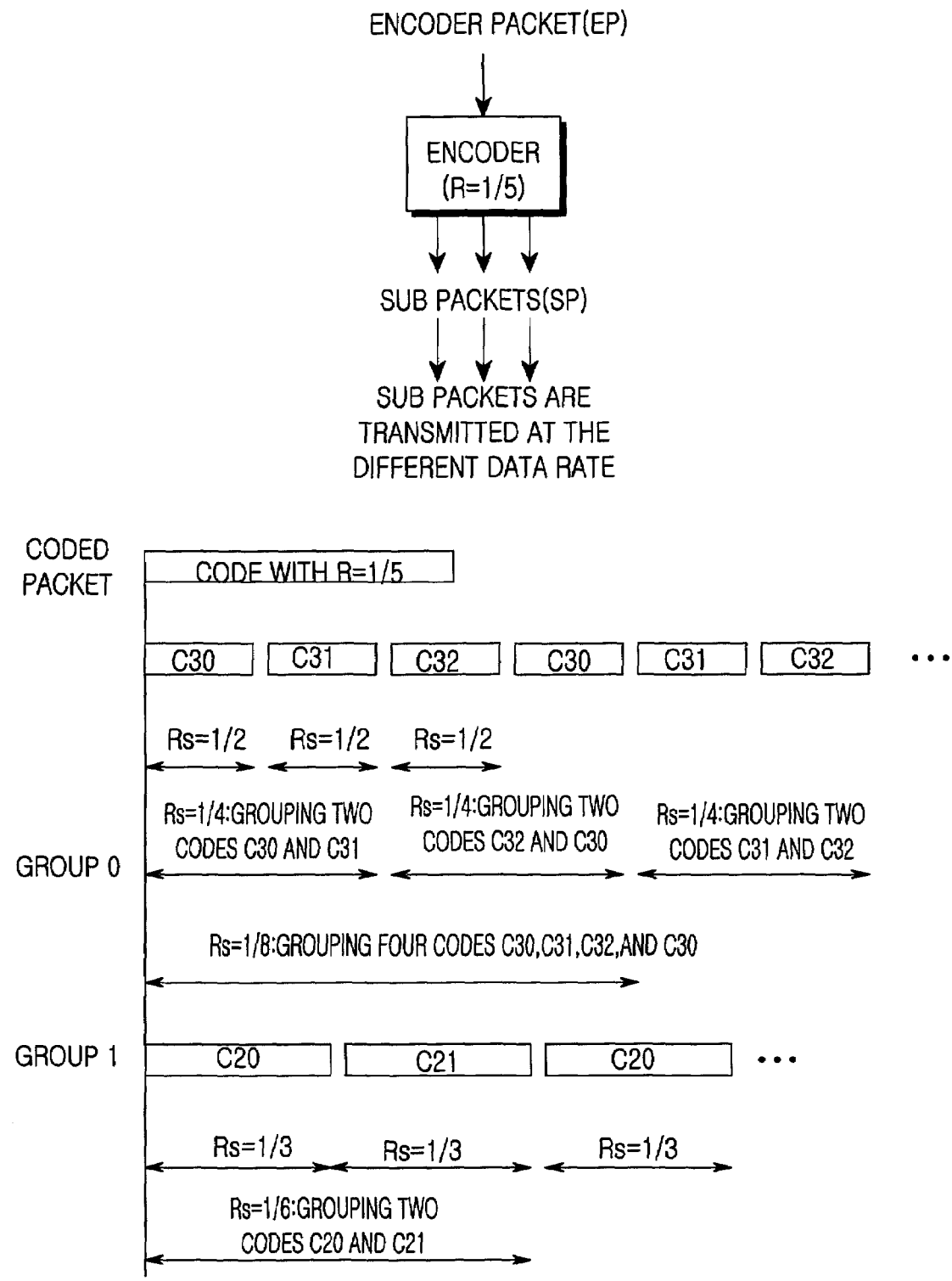
FIG. 9 is a diagram illustrating an implementation of adaptive QCTC generation according to the first embodiment of the present invention.

FIG. 9 is a diagram illustrating an implementation of adaptive QCTC generation according to the second embodiment of the present invention. In FIG. 9, a mother code rate R=1/5, QCTCs with code rates of 1/2, 1/4, 1/8 are in group 0, and QCTCs with code rates of 1/3 and 1/6 are in group 1. For group 0, a rate 1/2 QCTC is a primitive code $C_p$ and for group 1, a rate 1/3 QCTC is a primitive code $C_p$. With the primitive codes $C_p$, QCTCs with the code rates of 1/2, 1/4, 1/8, and 1/3 are generated.

For group 0, if the rate 1/2 QCTC is $C_3$, rate 1/4 sub-codes and rate 1/8 sub-codes are generated by sequentially grouping the sub-codes $C_{30}$, $C_{31}$ and $C_{32}$ according to grouping numbers. For example, the rate 1/4 sub-codes are produced by grouping two sub-codes such as ($C_{30}$, $C_{01}$), ($C_{32}$, $C_{30}$), and ($C_{31}$, $C_{32}$), and the rate 1/8 sub-codes, by grouping four sub-codes ($C_{30}$, $C_{31}$, $C_{32}$, $C_{30}$). For group 1, if rate 1/3 QCTC is $C_2$, the rate 1/6 sub-codes are generated by grouping two sub-codes, such as ($C_{20}$, $C_{21}$).

Figure 10:
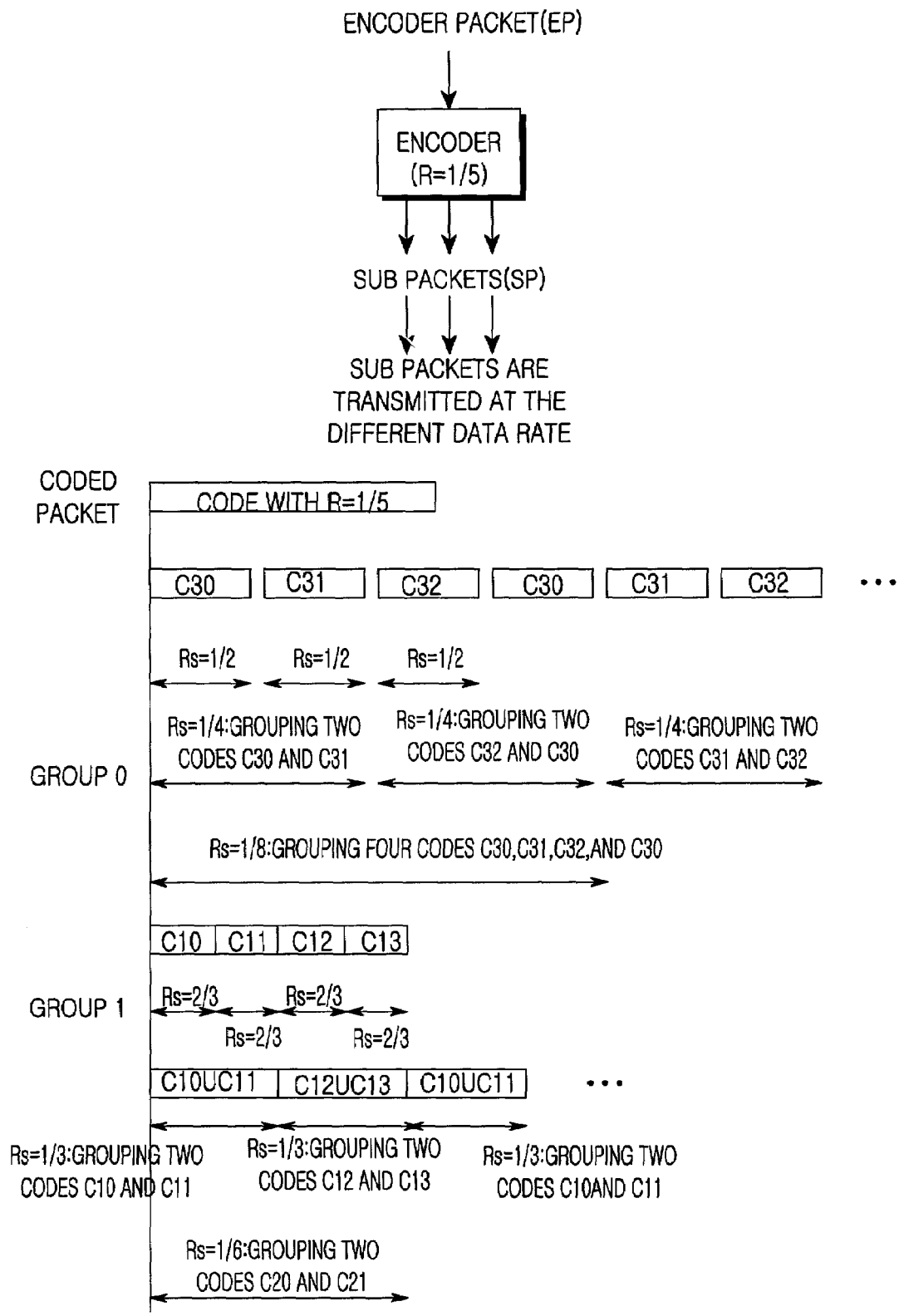
FIG. 10 is a diagram illustrating another implementation of adaptive QCTC generation according to the first embodiment of the present invention.

FIG. 10 is a diagram illustrating another implementation of adaptive QCTC generation according to the second embodiment of the present invention. In FIG. 10, a mother code rate R=1/5, QCTCs with code rates of 1/2, 1/4 and 1/8 are in group 0, and QCTCs with code rates of 2/3, 1/3, and 1/6 are in group 1. For group 0, the rate 1/2 QCTC is a primitive code $C_p$ and for group 1, the rate 2/3 QCTC is a primitive code $C_p$. With the primitive codes $C_p$, QCTCs with the code rates of 1/2, 1/4, 1/8, 2/3, 1/3 and 1/6 are generated.

For group 0, if the rate 1/2 QCTC is $C_3$, rate 1/4 sub-codes and rate 1/8 sub-codes are generated by sequentially grouping the sub-codes $C_{30}$, $C_{31}$ and $C_{32}$ according to grouping numbers. For example, the rate 1/4 sub-codes are produced by grouping two sub-codes such as ($C_{30}$, $C_{01}$), ($C_{32}$, $C_{30}$), and ($C_{31}$, $C_{32}$), and the rate 1/8 sub-codes are provided, by grouping four sub-codes ($C_{30}$, $C_{31}$, $C_{32}$, $C_{30}$). For group 1, if the rate 2/3 QCTC is $C_1$, the rate 1/3 sub-codes and the rate 1/6 sub-codes are generated by sequentially grouping the sub-codes $C_{10}$, $C_{11}$, $C_{12}$, and $C_{13}$ according to grouping numbers. Specifically, the rate 1/3 sub-codes are generated by grouping two sub-codes of the primitive code $C_p$ with the code rate 2/3, such as ($C_{10}$, $C_{11}$), ($C_{12}$, $C_{12}$), or ($C_{10}$, $C_{11}$), and the rate 1/6 sub-codes are generated by grouping four sub-codes of the primitive code $C_p$ with the code rate 2/3, such as ($C_{10}$, $C_{11}$, $C_{12}$, $C_{13}$). The code structure shown in FIG. 10 is more adaptive to changes in channel condition and data rate.

If an HARQ system uses QCTCs with various code rates according to channel environment, HARQ II is preferable. Then, sub-codes with higher code rates are required and thus a QCTC with R=2/3 will be used as a primitive code. Obviously, a primitive code is determined according to a maximum code rate that the system requires, of which the description is beyond the scope of the present invention, and an adaptive QCTC is generated in the above-described manner. For example, for R=3/4, sub-codes with R=3/4, R=2/3, R=1/3, R=1/6, etc. can be generated in the same manner.

Table 4 lists the puncturing matrixes of sub-codes that are generated by use of primitive codes $C_p$ with R=1/2 and R=1/3. Table 5 lists the puncturing matrixes of sub-codes that are generated by use of primitive codes $C_p$ with R=1/2 and R=2/3.

TABLE 4

| Code rates ($R_i$) | $C_{i0}$ | $C_{i1}$ | $C_{i2}$ | $C_{i3}$ |
|---|---|---|---|---|
| $R_0 = 1/2$ | $\begin{bmatrix} 0 & 0 \\ 0 & 1 \\ 1 & 0 \\ 1 & 0 \\ 0 & 1 \end{bmatrix}$ | $\begin{bmatrix} 1 & 1 \\ 1 & 0 \\ 0 & 0 \\ 0 & 1 \\ 0 & 0 \end{bmatrix}$ | $\begin{bmatrix} 1 & 1 \\ 0 & 0 \\ 0 & 1 \\ 0 & 0 \\ 1 & 0 \end{bmatrix}$ | NA |
| $R_1 = 1/4$ | $\begin{bmatrix} 1 & 1 \\ 1 & 1 \\ 1 & 0 \\ 1 & 1 \\ 0 & 1 \end{bmatrix}$ | $\begin{bmatrix} 1 & 1 \\ 0 & 1 \\ 1 & 1 \\ 1 & 0 \\ 1 & 1 \end{bmatrix}$ | $\begin{bmatrix} 2 & 2 \\ 1 & 0 \\ 0 & 1 \\ 0 & 1 \\ 1 & 0 \end{bmatrix}$ | NA |
| $R_2 = 1/6$ | $\begin{bmatrix} 2 & 2 \\ 1 & 1 \\ 1 & 1 \\ 1 & 1 \\ 1 & 1 \end{bmatrix}$ | $\begin{bmatrix} 2 & 2 \\ 1 & 1 \\ 1 & 1 \\ 1 & 1 \\ 1 & 1 \end{bmatrix}$ | $\begin{bmatrix} 2 & 2 \\ 1 & 1 \\ 1 & 1 \\ 1 & 1 \\ 1 & 1 \end{bmatrix}$ | NA |
| $R_3 = 1/8$ | $\begin{bmatrix} 3 & 3 \\ 2 & 1 \\ 1 & 1 \\ 1 & 2 \\ 1 & 1 \end{bmatrix}$ | $\begin{bmatrix} 2 & 2 \\ 1 & 2 \\ 2 & 1 \\ 2 & 1 \\ 1 & 2 \end{bmatrix}$ | $\begin{bmatrix} 3 & 3 \\ 1 & 1 \\ 1 & 2 \\ 1 & 1 \\ 2 & 1 \end{bmatrix}$ | NA |
| $R_4 = 1/3$ | $\begin{bmatrix} 1 \\ 0 \\ 1 \\ 0 \\ 1 \end{bmatrix}$ | $\begin{bmatrix} 1 \\ 1 \\ 0 \\ 1 \\ 0 \end{bmatrix}$ | NA | NA |

TABLE 5

| Code rates ($R_i$) | $C_{i0}$ | $C_{i1}$ | $C_{i2}$ | $C_{i3}$ |
|---|---|---|---|---|
| $R_0 = 1/2$ | $\begin{bmatrix} 0 & 0 \\ 0 & 1 \\ 1 & 0 \\ 1 & 0 \\ 0 & 1 \end{bmatrix}$ | $\begin{bmatrix} 1 & 1 \\ 1 & 0 \\ 0 & 0 \\ 0 & 1 \\ 0 & 0 \end{bmatrix}$ | $\begin{bmatrix} 1 & 1 \\ 0 & 0 \\ 0 & 1 \\ 0 & 0 \\ 1 & 0 \end{bmatrix}$ | NA |
| $R_1 = 1/4$ | $\begin{bmatrix} 1 & 1 \\ 1 & 1 \\ 1 & 0 \\ 1 & 1 \\ 0 & 1 \end{bmatrix}$ | $\begin{bmatrix} 1 & 1 \\ 0 & 1 \\ 1 & 1 \\ 1 & 0 \\ 1 & 1 \end{bmatrix}$ | $\begin{bmatrix} 2 & 2 \\ 1 & 0 \\ 0 & 1 \\ 0 & 1 \\ 1 & 0 \end{bmatrix}$ | NA |
| $R_2 = 1/6$ | $\begin{bmatrix} 2 & 2 \\ 1 & 1 \\ 1 & 1 \\ 1 & 1 \\ 1 & 1 \end{bmatrix}$ | $\begin{bmatrix} 2 & 2 \\ 1 & 1 \\ 1 & 1 \\ 1 & 1 \\ 1 & 1 \end{bmatrix}$ | $\begin{bmatrix} 2 & 2 \\ 1 & 1 \\ 1 & 1 \\ 1 & 1 \\ 1 & 1 \end{bmatrix}$ | NA |
| $R_3 = 1/8$ | $\begin{bmatrix} 3 & 3 \\ 2 & 1 \\ 1 & 1 \\ 1 & 2 \\ 1 & 1 \end{bmatrix}$ | $\begin{bmatrix} 2 & 2 \\ 1 & 2 \\ 2 & 1 \\ 2 & 1 \\ 1 & 2 \end{bmatrix}$ | $\begin{bmatrix} 3 & 3 \\ 1 & 1 \\ 1 & 2 \\ 1 & 1 \\ 2 & 1 \end{bmatrix}$ | NA |

TABLE 5-continued

| Code rates ($R_i$) | $C_{i0}$ | $C_{i1}$ | $C_{i2}$ | $C_{i3}$ |
|---|---|---|---|---|
| $R_4 = 2/3$ | $\begin{bmatrix} 1 & 1 & 1 & 1 \\ 1 & 0 & 0 & 0 \\ 0 & 0 & 0 & 0 \\ 0 & 0 & 1 & 0 \\ 0 & 0 & 0 & 0 \end{bmatrix}$ | $\begin{bmatrix} 0 & 0 & 0 & 0 \\ 0 & 1 & 1 & 1 \\ 0 & 0 & 0 & 0 \\ 1 & 1 & 0 & 1 \\ 0 & 0 & 0 & 0 \end{bmatrix}$ | $\begin{bmatrix} 0 & 0 & 0 & 0 \\ 0 & 0 & 0 & 0 \\ 1 & 1 & 0 & 1 \\ 0 & 0 & 0 & 0 \\ 0 & 1 & 1 & 1 \end{bmatrix}$ | $\begin{bmatrix} 1 & 1 & 1 & 1 \\ 0 & 0 & 0 & 0 \\ 0 & 0 & 1 & 0 \\ 0 & 0 & 0 & 0 \\ 1 & 0 & 0 & 0 \end{bmatrix}$ |
| $R_5 = 1/3$ | $\begin{bmatrix} 1 & 1 & 1 & 1 \\ 1 & 1 & 1 & 1 \\ 0 & 0 & 0 & 0 \\ 1 & 1 & 1 & 1 \\ 0 & 0 & 0 & 0 \end{bmatrix}$ | $\begin{bmatrix} 1 & 1 & 1 & 1 \\ 0 & 0 & 0 & 0 \\ 0 & 1 & 1 & 1 \\ 0 & 0 & 0 & 0 \\ 1 & 1 & 1 & 1 \end{bmatrix}$ | $\begin{bmatrix} 1 & 1 & 1 & 1 \\ 1 & 1 & 1 & 1 \\ 0 & 0 & 0 & 0 \\ 1 & 1 & 1 & 1 \\ 0 & 0 & 0 & 0 \end{bmatrix}$ | $\begin{bmatrix} 1 & 1 & 1 & 1 \\ 0 & 0 & 0 & 0 \\ 1 & 1 & 1 & 1 \\ 0 & 0 & 0 & 0 \\ 1 & 1 & 1 & 1 \end{bmatrix}$ |

As seen from Table 4 and Table 5, the sub-codes are produced by grouping the sub-codes of the primitive codes $C_p$. The sub-codes of a QCTC with a given code rate are generated by sequentially grouping the sub-codes of a primitive code $C_p$. In Table 4, two QCTC groups having the primitive codes with R=1/2 and R=1/3 are defined. The puncturing matrixes are the elements of the sub-code matrix shown in Eq. (12). For example, $C_{p0}^1$, $C_{p1}^1$, and $C_{p2}^1$ in Eq. (12) correspond to the puncturing matrixes for the first, second, and third sub-codes $C_{00}$, $C_{01}$, and $C_{02}$ of $R_0=1/2$, respectively. $C_{p1}^2$ and $C_{p2}^2$ correspond to the second sub-code $C_{11}$ ($C_{02} \cup C_{00}$) and the third sub-code $C_{12}$ ($C_{01} \cup C_{02}$) of $R_1=1/4$, respectively. Table 5 illustrates the sub-codes of two groups with primitive codes of R=1/2 and R=2/3.

The mobile station and the system include tables such as Table 4 and Table 5 from which puncturing matrixes with a given code rate (or data rate) are read. Sub-codes are generated by repeating and puncturing symbols output from a turbo encoder with a mother code rate in correspondence with the puncturing matrixes. Alternatively, the puncturing matrixes are obtained in a predetermined algorithm and the sub-codes are generated based on the puncturing matrixes.

Figure 13:
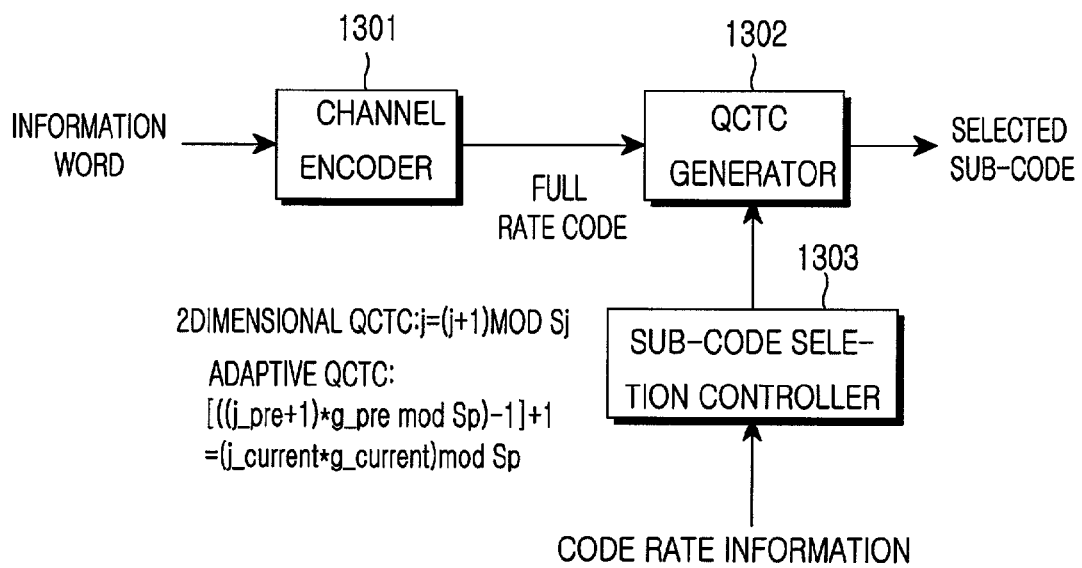
FIG. 13 is a block diagram of a transmitting apparatus for transmitting the two-dimensional QCTCs and the adaptive QCTCs according to the present invention.

FIG. 13 is a block diagram of a transmitting apparatus for transmitting two-dimensional QCTCs and adaptive QCTCs according to the present invention. Referring to FIG. 13, a channel encoder 1301 encodes input information symbols at a mother code rate R=1/5, for example, and outputs code symbols. A QCTC generator 1302 generates a sub-code by puncturing and repeating the code symbols under the control of a sub-code selection controller 1303.

The controller 1303 has a memory for storing puncturing matrixes as shown in Table 3 to Table 5 by which sub-codes are generated. The controller 1303 controls the QCTC generator 1302 in an algorithm as illustrated in FIG. 12 when generating two-dimensional QCTCs, and in an algorithm as illustrated in FIG. 11 when generating adaptive QCTCs.

Figure 11:
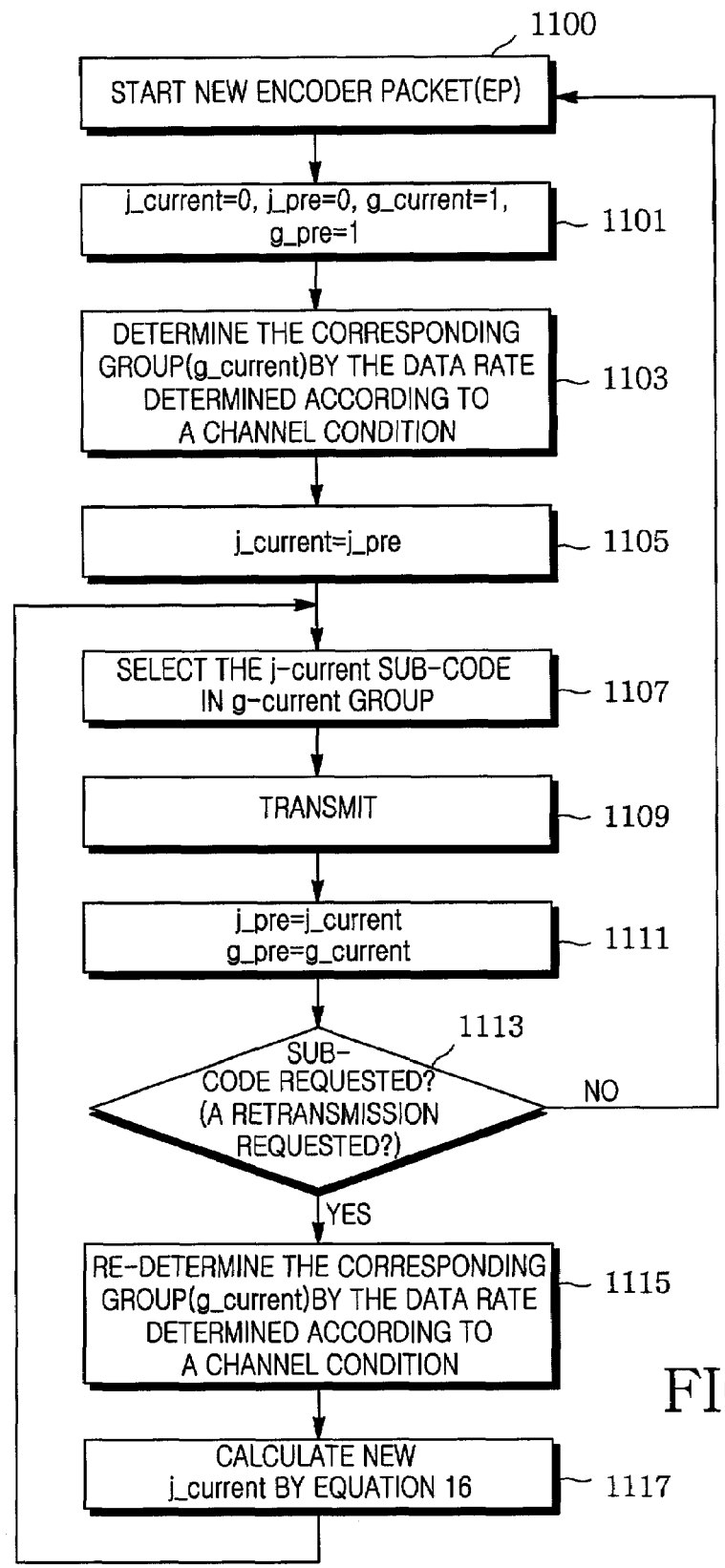
FIG. 11 is a flowchart illustrating sub-code transmission using the adaptive QCTCs according to the second embodiment of the present invention.
Figure 12:
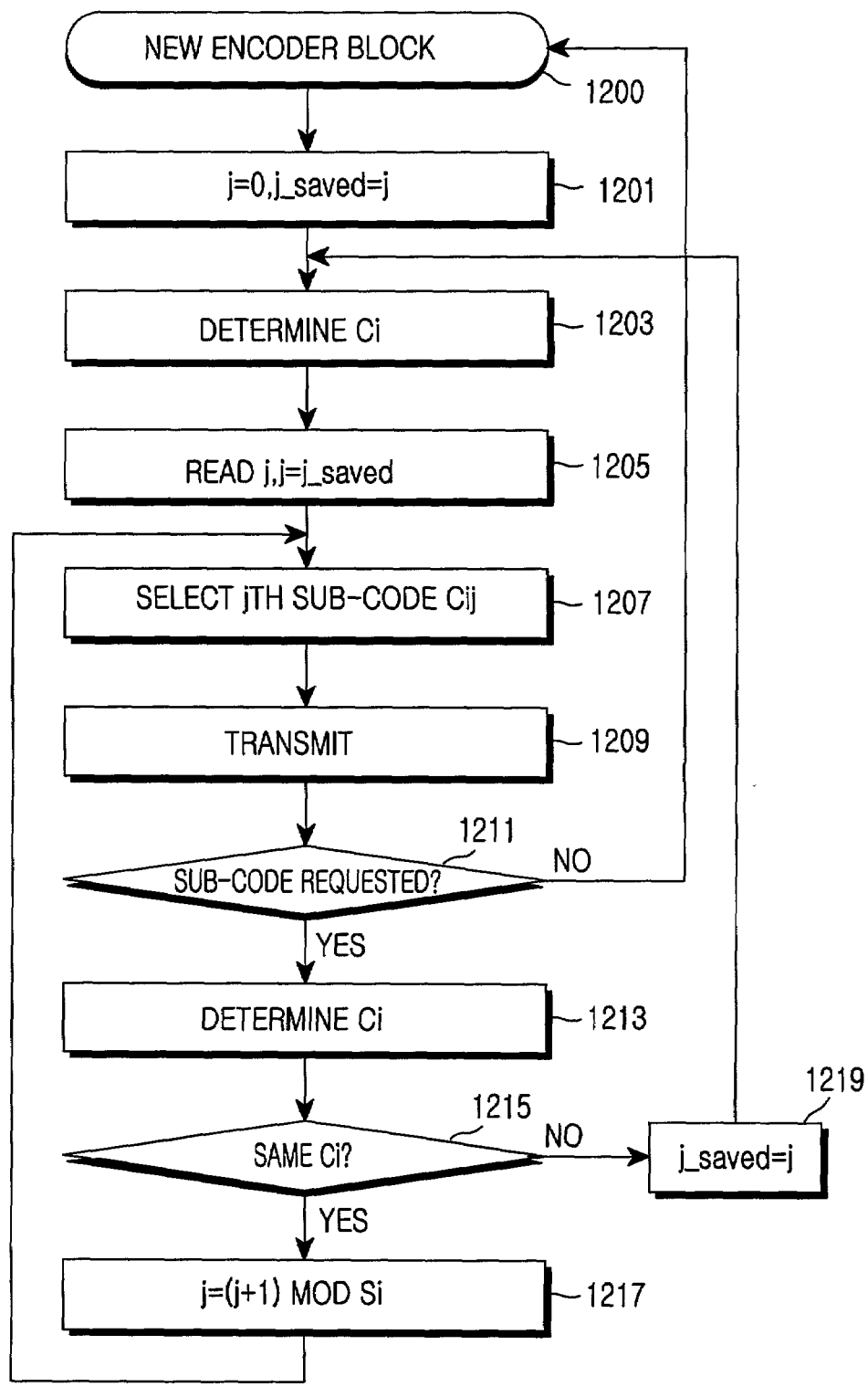
FIG. 12 is a flowchart illustrating sub-code transmission using the two-dimensional QCTCs according to the first embodiment of the present invention.

Alternatively, the controller 1303 may transmit an index signal to the QCTC generator 1302 to select one of the puncturing matrixes shown in Table 3 to Table 5 by performing the algorithms illustrated in FIG. 11 and FIG. 12 at each sub-code transmission time. In this case, the QCTC generator 1302 reads a puncturing matrix corresponding to the index from Table 3 to Table 5 and generates a sub-code by puncturing and repeating the symbols output from the channel encoder 1301 based on the puncturing matrix.

Herein below, a description of selection (or transmission) of a sub-code in the controller 1303 will be given.

FIG. 11 is a flowchart illustrating sub-code transmission using one-dimensional adaptive QCTCs according to the second embodiment of the present invention. Referring to FIG. 11, upon generating of a new encoder block in step 1100, the controller 1303 sets all variables (j_current, j_pre, g_current and gpre to initial values in step 1101. In step 1103, the controller 1303 selects a QCTC group including a QCTC with a given code rate and determines a grouping number g, that is, the number of sub-codes to be grouped in a primitive code $C_p$. Here, the code rate is determined according to a channel condition and the data rate of input data in the transmitter. The grouping number g is a variable by which a QCTC included in the group is identified. After determining the group and the grouping number g_current, the controller 1303 reads a variable j_pre stored for the QCTC $C_i$ with the code rate and sets a variable j_current to the read value in step 1105. The j_current indicates the sequence number of a sub-code in a QCTC. Then, the controller 1303 selects the jth_current sub-code of the QCTC corresponding to the variable g_current in the group in step 1107 and transmits the coded symbol corresponding to the selected sub-code in step 1109. For the next transmission, in step 1111 the variables g_current and j_current are stored as variables g_pre and j_pre. Sub-codes corresponding to j_current(=0), that is, the first sub-codes of the QCTCs are expressed as $$\forall g \, C_{p0}^g, g = 1, \ldots, \quad (15)$$

Then, a sub-code corresponding to g_current (or g) is selected among the first sub-codes.

After transmitting the sub-code, the controller 1303 determines whether another sub-code is requested, that is, whether a retransmission request has been received from a receiver in step 1111. Upon request from another sub-code, the controller 1303 transmits a sub-code with a given rate in step 1113. Otherwise, the controller 1303 returns to step 1100 to receive a new coded block.

Meanwhile, the controller 1303 selects a QCTC group (g_current) including a QCTC with the given code rate that is determined according to the channel and transmission environments in step 1115.

In step 1117, the controller 1303 determines the sequence number j_current of a sub-code to be transmitted (an element in the group matrix) according to the following equation 16 and returns to step 1107 in which a sub-code corresponding to the variable g_current is transmitted among the sub-codes corresponding to the variable j_current.

$$[((j\_pre+1)*g\_pre \bmod Sp)-1]+1 = (j\_current*g\_current) \bmod Sp \tag{16}$$

In the above equation, the left side, "[(j_pre+1)*g_pre mod Sp)–1]" means a sub-code ended in the previous group, and the right side, "(j_current*g_current) mod Sp" means a sub-code started with the next group. Therefore, in case of adding 1 to "[((j_pre+1)*g_pre mod Sp)–1]", it means the sub-code started with the next group so that each side of the equation has the same value. In this manner, the value of j_current may be obtained.

In the above equation, A mod B is an operation of achieving the quotient of A divided by B. That is, if the variable g_pre indicates the grouping number of sub-codes of a primitive code for generating the previous sub-code, i.e., the identification number of the QCTC with the previous sub-code, and j_pre indicates the sequence number of the previous sub-code, the sequence number of the current sub-code to be transmitted, j_current is determined by Eq. (16). Among the sub-codes in the column corresponding to the variable j_current, a sub-code is selected in the row corresponding to the variable g_current that is determined according to the code rate. The reason for using "mod $S_p$" in Eq. (16) is that the number of the columns in the group matrix is equal to or less than $S_p$. Since the number of the sub-codes of the primitive code is $S_p$, "mod Sp" enables a recursive selection of the first sub-code $C_{p0}$ after transmission of all sub-codes in each row (see FIGS. 9 and 10).

The operation of FIG. 11 will be described in more detail with specific numerical citations.

On the assumption that the code rate of a primitive code, $R_s=1/2$, the number of rows in a group matrix g=4 (that is, up to a QCTC with $R_s=1/8$ can be generated), $S_p=3$, code rates are changed in the order of $R_s=1/2$, $R_s=1/4$, $R_s=1/2$, $R_s=1/8$, and then g_pre=0, j_current=0, g_current=0 and j_pre=0 (initial value), then 1. R=1/2: g_current=1 and j_current=0, so g_pre=1 and j_pre=0.
   Selected sub-code: $C_{p0}^1$
2. R=1/4: g_current=2 and j_current=2, so g_pre=2 and j_pre=1.
   Selected sub-code: $C_{p2}^2$
3. R=1/2: g_current=1 and j_current=0, so g_pre=1 and j_pre=0.
   Selected sub-code: $C_{p0}^1$
4. R=1/8: g_current=4 and j_current=1, so g_pre=4 and j_pre=1.
   Selected sub-code: $C_{p1}^4$
5. R=1/2: g_current=1 and j_current=2, so g_pre=1 and j_pre=2.
   Selected sub-code: $C_{p2}^1$ A sub-code within each group is selected according to Eq. (16) and a group is selected according to a code rate that depends on a channel environment and an input data rate. As shown in FIGS. 9 and 10, initial sub-code transmission is carried out with j=0. While the puncturing matrixes for the sub-codes of each QCTC are listed in memory tables such as Table 3 to Table 5 in the embodiment of the present invention, it can be further contemplated as another embodiment that the sub-codes of a primitive code for each group are provided and an intended sub-code is generated by grouping the sub-codes of the primitive code by Eq. (16). In the latter case, if j_current is calculated in Eq. (16), the controller can generate a transmission sub-code by grouping g successive sub-codes of the primitive code, starting from a sub-code corresponding to j_current.

FIG. 12 is a flowchart illustrating sub-code transmission using two-dimensional QCTCs according to the first embodiment of the present invention. Referring to FIG. 12, upon generation of a new encoder block in step 1200, the controller 1303 sets all variables (j and j_saved) to initial values in step 1201. In step 1203, the controller 1303 determines a QCTC $C_i$ according to a given code rate. Here, the code rate is determined according to channel condition and the data rate of input data in the transmitter. The controller 1303 reads a variable j_saved stored for the QCTC $C_i$ in step 1205, selects the jth sub-code $C_{ij}$ among the sub-codes of the QCTC in step 1207 and transmits the coded symbol by using the selected sub-code in step 1209.

After transmitting the sub-code, the controller 1303 determines whether another sub-code is requested, that is, whether a retransmission request has been received from a receiver in step 1211. Upon request of another sub-code, the controller 1303 selects a sub-code with a code rate determined according to the channel environment in step 1213. Otherwise, the controller 1303 returns to step 1200 to check whether a new encoder block has been received.

Meanwhile, the controller 1303 determines whether the selected sub-code is identical to the previous one in step 1215. If they are identical, the controller 1303 updates the variable j by Eq. (17) and returns to step 1207. If they are different, the controller 1303 increases the variable j representing the previous sub-code by 1 and stores the (j+1) as the variable j_saved in step 1219 and returns to step 1203.

$$j=(j+1) \bmod S_i \tag{17}$$

where $S_i$ is the set size of the QCTC $C_i$. The reason for using "mod $S_i$" in Eq. (17) is to enable a recursive selection of the first sub-code after transmission of all sub-codes of the QCTC.

In accordance with the present invention as described above, a retransmission communication system can select a different QCTC adaptively according to a given data rate or code rate. In other words, two-dimensional QCTCs and adaptive QCTCs are used for packet retransmission, thereby remarkably increasing throughput.

While the invention has been shown and described with reference to certain preferred embodiments thereof, it will be understood by those skilled in the art that various changes in form and details may be made therein without departing from the spirit and scope of the invention as defined by the appended claims.

What is claimed is:

1. A computer program device readable by a machine, tangibly embodying a program of instructions executable by the machine for generating sub-codes of ordered sub-code sets, to perform method steps of:

generating ordered sub-code sets with given code rates, each sub-code belonging to one ordered sub-code set having the same code rate and each ordered sub-code set having a different code rate;

rearranging an order of the sub-codes of an ordered sub-code set with a same or different code rate that is to be used after a sub-code with a predetermined code rate according to a priority of the sub-codes; and transmitting data using a sub-code in an ordered sub-code set.

2. The device of claim 1, wherein the sub-code is represented by a matrix with elements representing puncturing and repetition positions.

3. The device of claim 1, wherein the rearranging step comprises the steps of:
generating new ordered sub-code sets, a representative matrix for each sub-code in each new ordered sub-code set having as many columns as the least common multiple of the numbers of columns of each sub-code in the ordered sub-code sets; and
determining priority of the matrixes of sub-codes in each new ordered sub-code set so that a matrix generated by combining matrixes from two of the new ordered sub-code sets has a quasi-complementary turbo code (QCTC) characteristic, a higher priority assigned to a more desirable QCTC characteristic, and rearranging the matrixes in each new sub-code according to the priority, wherein the QCTC characteristic are the elements of the matrix that have a uniform distribution of repetition and puncturing.

4. A computer program device readable by a machine, tangibly embodying a program of instructions executable by the machine for rearranging matrixes of sub-codes of ordered sub-code sets, to perform method steps of:
generating ordered sub-code sets corresponding to a plurality of system code rates, each sub-code of the ordered sub-code set represented in a matrix format with elements representing repetition and puncturing positions;
generating new sub-code sets, a matrix of each sub-code in a new ordered sub-code set having as many columns as a least common multiple of the numbers of columns of sub-codes in the ordered sub-code sets;
determining priority of the matrixes of sub-codes in each new ordered sub-code set so that a matrix generated by combining matrixes from two of the new ordered sub-code sets has a quasi-complementary turbo code (QCTC) characteristic, a higher priority assigned to a more desirable QCTC characteristic, wherein the QCTC characteristic are the elements of the matrix that have a uniform distribution of repetition and puncturing;

rearranging the matrixes in each new sub-code in the ordered sub-code sets with a same or different code rate that is to be used after a sub-code with a predetermined code rate according to the priority; and
transmitting data using a sub-code in an ordered sub-code set.

5. A computer program device readable by a machine, tangibly embodying a program of instructions executable by the machine for transmitting data_using sub-codes of ordered sub-code sets, to perform method steps of:
generating ordered sub-code sets with given code rates;
rearranging an order of the sub-codes in the ordered sub-code sets with a same or different code rate that is to be used after a sub-code with a predetermined code rate according to a priority of the sub-codes;
storing the rearranged sub-codes;
selecting an ordered sub-code set with a code rate determined for transmission; and
transmitting data using a sub-code in the selected ordered sub-code set.

6. The device of claim 5, wherein the rearranging step comprises the steps of:
generating new ordered sub-code sets, a representative matrix of each sub-code of the new ordered sub-code set having as many columns as the least common multiple of numbers of the columns of each sub-codes in the ordered sub-code sets;
determining priority of the matrixes of sub-codes in each new ordered sub-code set so that a matrix generated by combining matrixes from two of the new ordered sub-code sets has a QCTC characteristic, a higher priority assigned to a more desirable QCTC characteristic, wherein the QCTC characteristic are the elements of the matrix that have a uniform distribution of repetition and puncturing; and
rearranging the matrixes in each new sub-code in the ordered sub-code sets with a same or different code rate that is to be used after a sub-code with a predetermined code rate, according to the priority.

* * * * *